US012218218B2

(12) United States Patent
Jhan et al.

(10) Patent No.: US 12,218,218 B2
(45) Date of Patent: Feb. 4, 2025

(54) NANOSTRUCTURES FORMED OVER A SUBSTRATE AND A GATE STRUCTURE WRAPPING AROUND THE NANOSTRUCTURES

(71) Applicant: Taiwan Semiconductor Manufacturing Company, Ltd., Hsinchu (TW)

(72) Inventors: Yi-Ruei Jhan, Keelung (TW); Kuo-Cheng Chiang, Zhubei (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 387 days.

(21) Appl. No.: 17/690,354

(22) Filed: Mar. 9, 2022

(65) Prior Publication Data
US 2023/0290859 A1 Sep. 14, 2023

(51) Int. Cl.
*H01L 29/66* (2006.01)
*H01L 27/088* (2006.01)
*H01L 29/06* (2006.01)
*H01L 29/08* (2006.01)
*H01L 29/417* (2006.01)
*H01L 29/423* (2006.01)
*H01L 29/786* (2006.01)

(52) U.S. Cl.
CPC ...... *H01L 29/66545* (2013.01); *H01L 27/088* (2013.01); *H01L 29/0673* (2013.01); *H01L 29/0847* (2013.01); *H01L 29/41766* (2013.01); *H01L 29/6653* (2013.01); *H01L 29/66742* (2013.01); *H01L 29/78696* (2013.01); *H01L 29/42392* (2013.01)

(58) Field of Classification Search
CPC . B82Y 10/00; H01L 27/088; H01L 29/41766; H01L 29/66553; H01L 29/66742; H01L 29/0673; H01L 29/6653; H01L 29/66545; H01L 29/0847; H01L 29/78696
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

*Primary Examiner* — Alonzo Chambliss
(74) *Attorney, Agent, or Firm* — Birch, Stewart, Kolasch & Birch, LLP

(57) ABSTRACT

A semiconductor device structure is provided. The semiconductor device structure includes a plurality of first nanostructures stacked over a substrate in a vertical direction. The semiconductor device structure includes a first gate structure surrounding the first nanostructures. The semiconductor device structure also includes a first gate spacer layer formed adjacent to the first gate structure. A topmost first nanostructure has a first portion directly below the gate spacer layer and a second portion directly below the first gate structure, and the first portion has a first height along the vertical direction, the second portion has a second height along the vertical direction, and the first height is greater than the second height.

20 Claims, 37 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,825,918 B2* | 11/2020 | Ching ............... H01L 29/785 |
| 2018/0315857 A1* | 11/2018 | Li ................. H01L 29/66818 |
| 2021/0226066 A1* | 7/2021 | Young ............ H01L 29/7848 |
| 2022/0271148 A1* | 8/2022 | Huang ............ H01L 29/7851 |
| 2023/0282723 A1* | 9/2023 | Lin ................ H01L 27/088 |
| | | 257/401 |

* cited by examiner

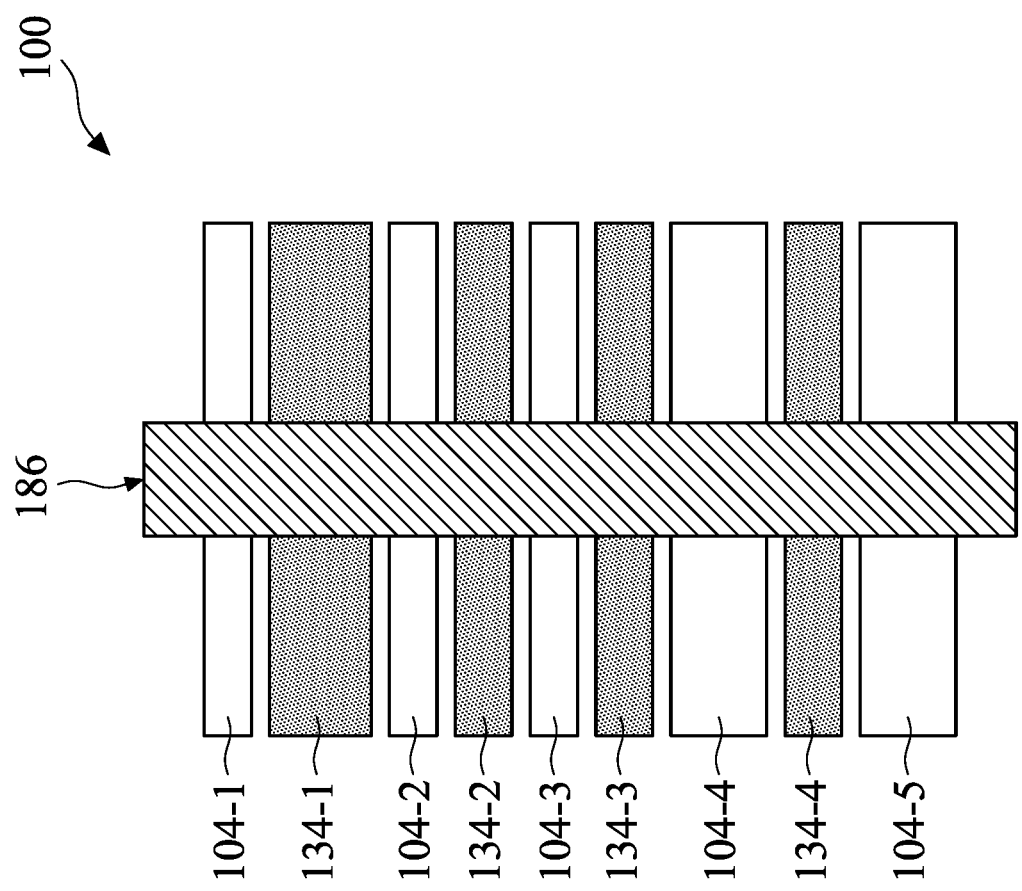

NANOSTRUCTURES FORMED OVER A SUBSTRATE AND A GATE STRUCTURE WRAPPING AROUND THE NANOSTRUCTURES

CROSS REFERENCE TO RELATED APPLICATIONS

Background

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 shows a top view of a semiconductor structure, in accordance with some embodiments.

DETAILED DESCRIPTION

Figure 2A:
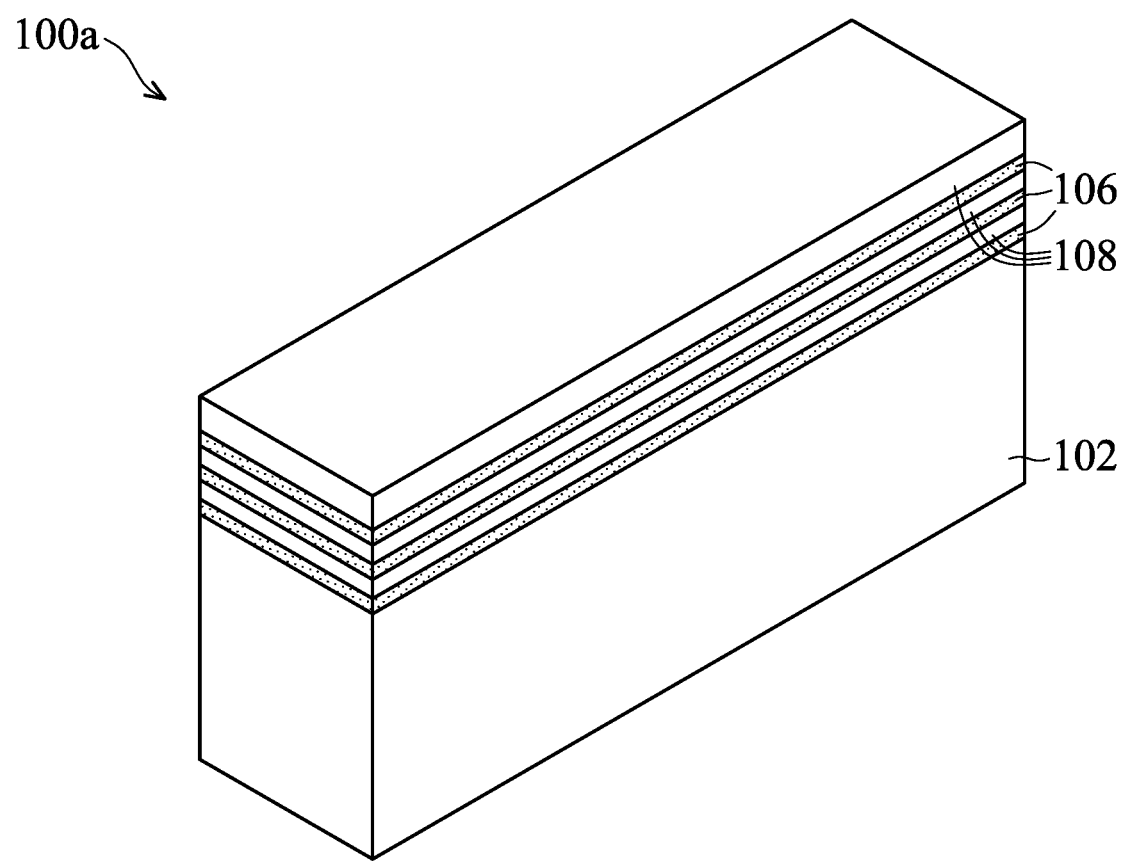
FIGS. 2A to 2W illustrate perspective views of intermediate stages of manufacturing a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The semiconductor device structure may include nanostructures formed over a substrate and a gate structure wraps around the nanostructures. The fin structure is formed over the substrate, and the fin structure includes a number of first semiconductor layers and a number of second semiconductor layers. The hard mask layer is formed over the fin structure and is patterned to form the trench. The gate spacer layer is formed in the trench and the dummy gate electrode layer (e.g. polysilicon) is formed on the gate spacer layer and in the trench. Note that the formation of the dummy gate electrode layer is after the gate spacer layer without using the photoresist layer. Therefore, the dummy gate structure has a low aspect ratio to reduce the risk of the dummy gate electrode layer (e.g. polysilicon) collapse. Therefore, the yield of the semiconductor device structure is improved.

FIG. 1 shows a top view of a semiconductor structure 100, in accordance with some embodiments. FIG. 1 has been simplified for the sake of clarity to better understand the inventive concepts of the present disclosure. Additional features may be added in the semiconductor structure 100, and some of the features described below may be replaced, modified, or eliminated.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

Figure 2B:
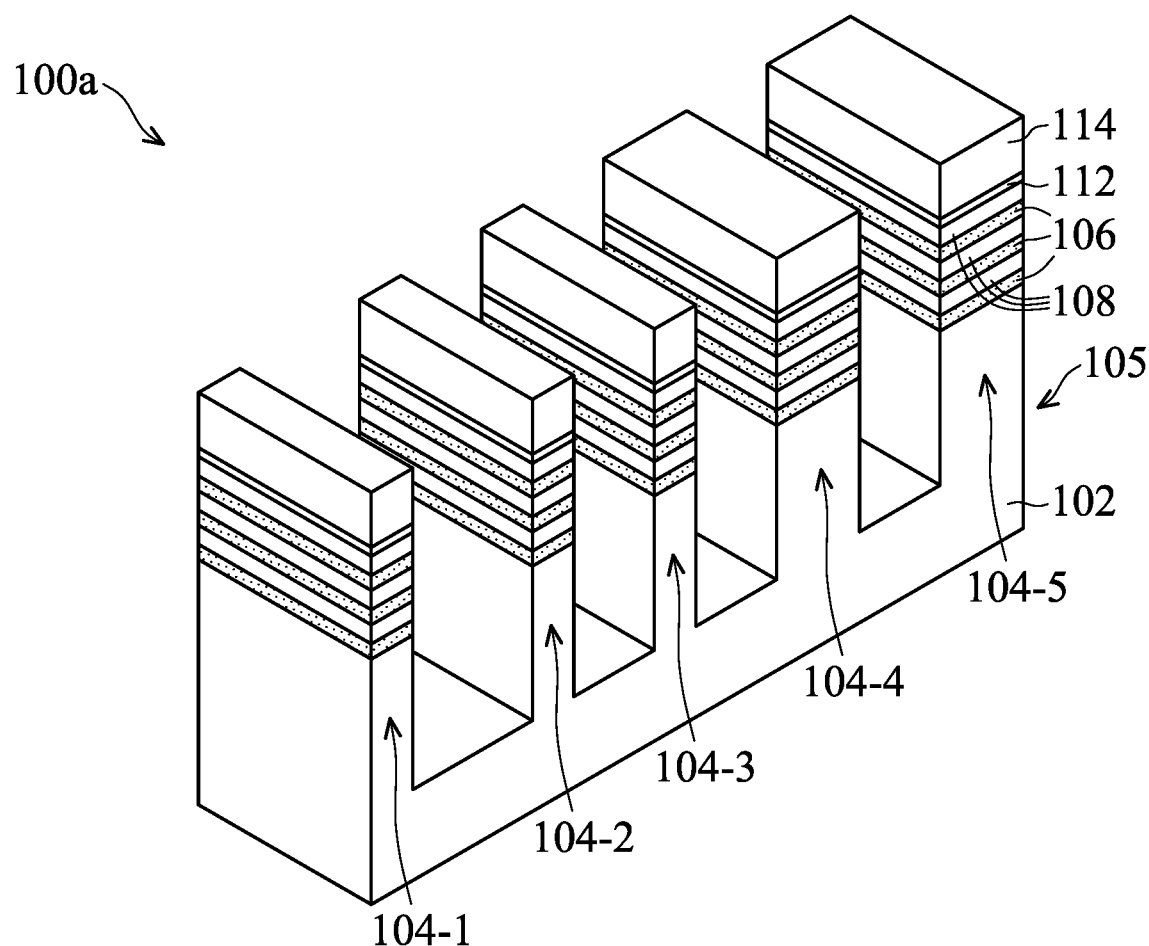
Figure 2C:
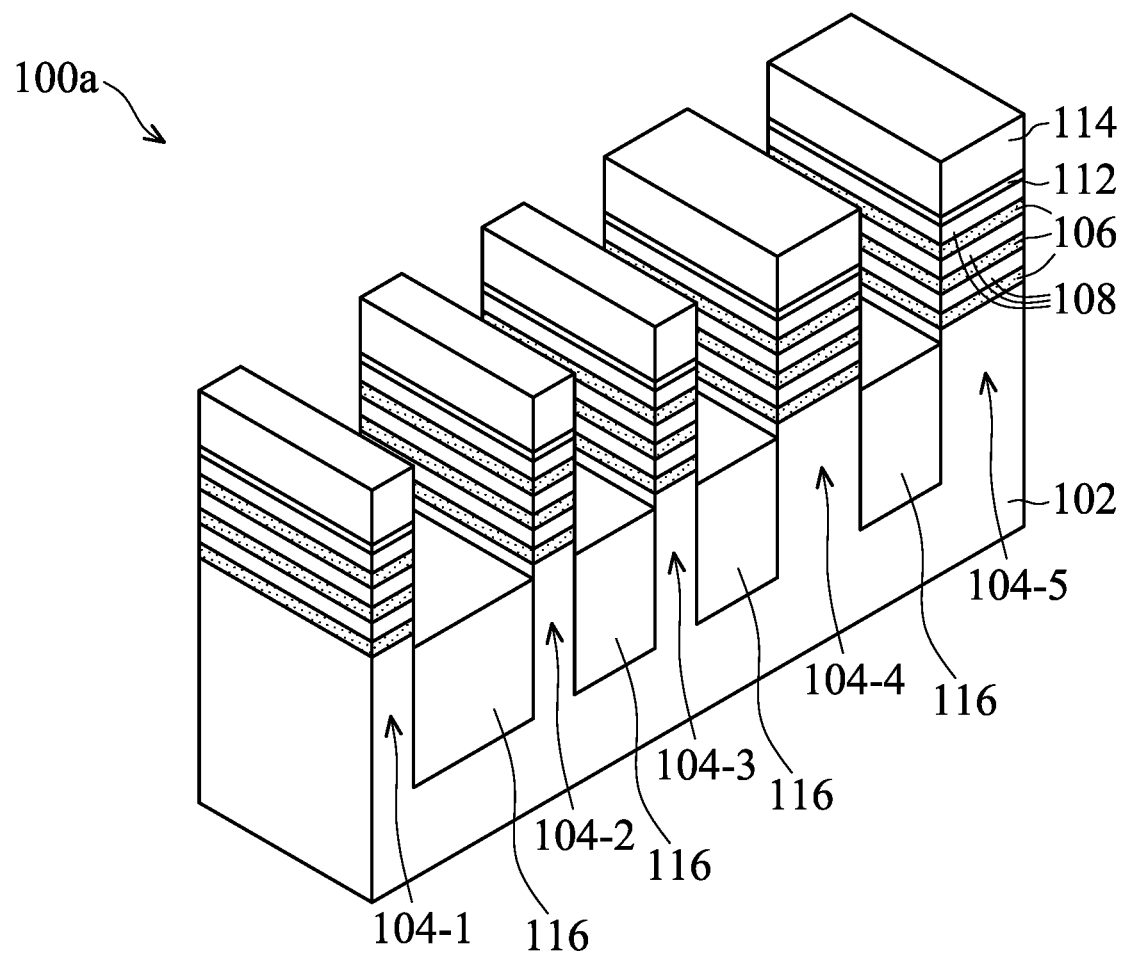
Figure 2D:
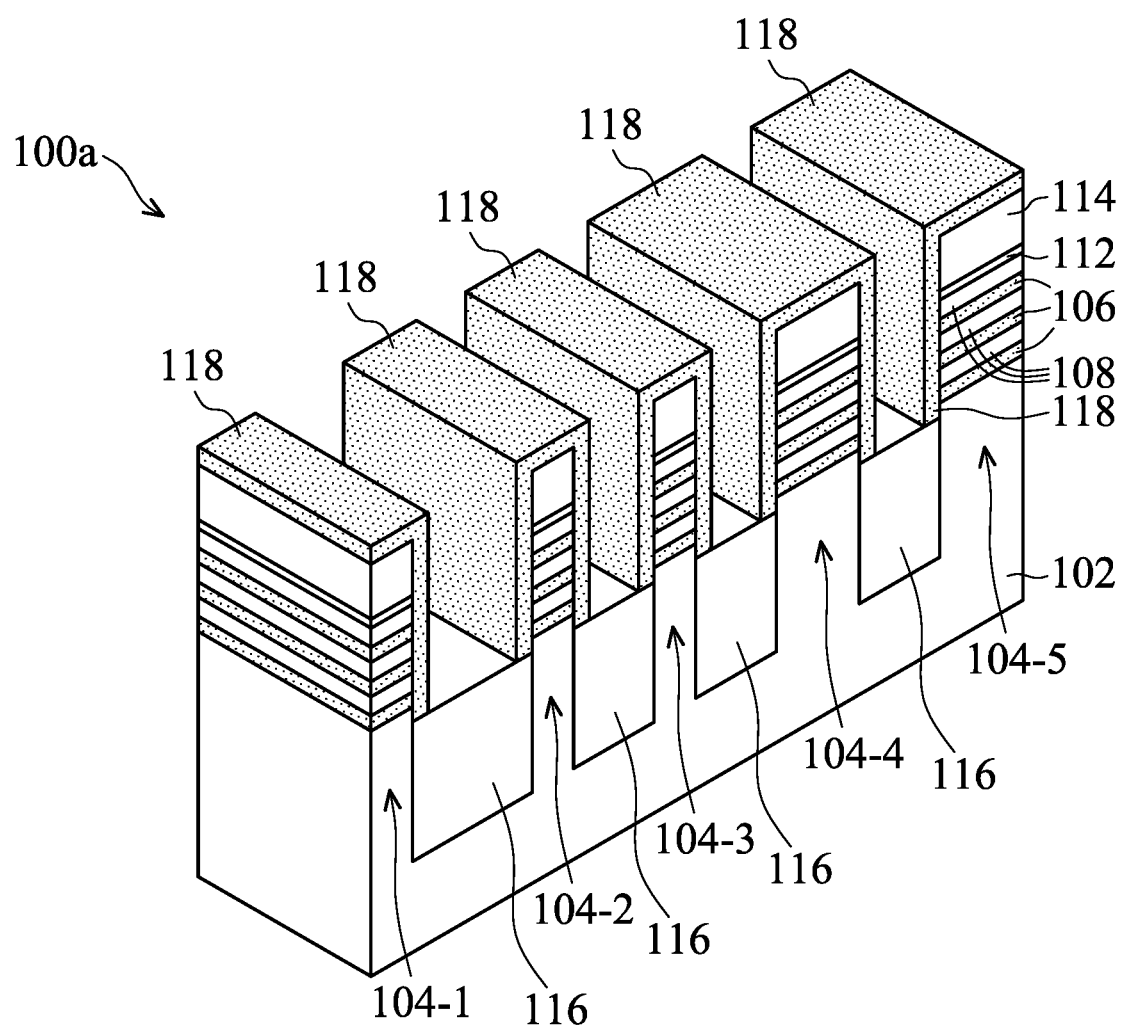
Figure 2E:
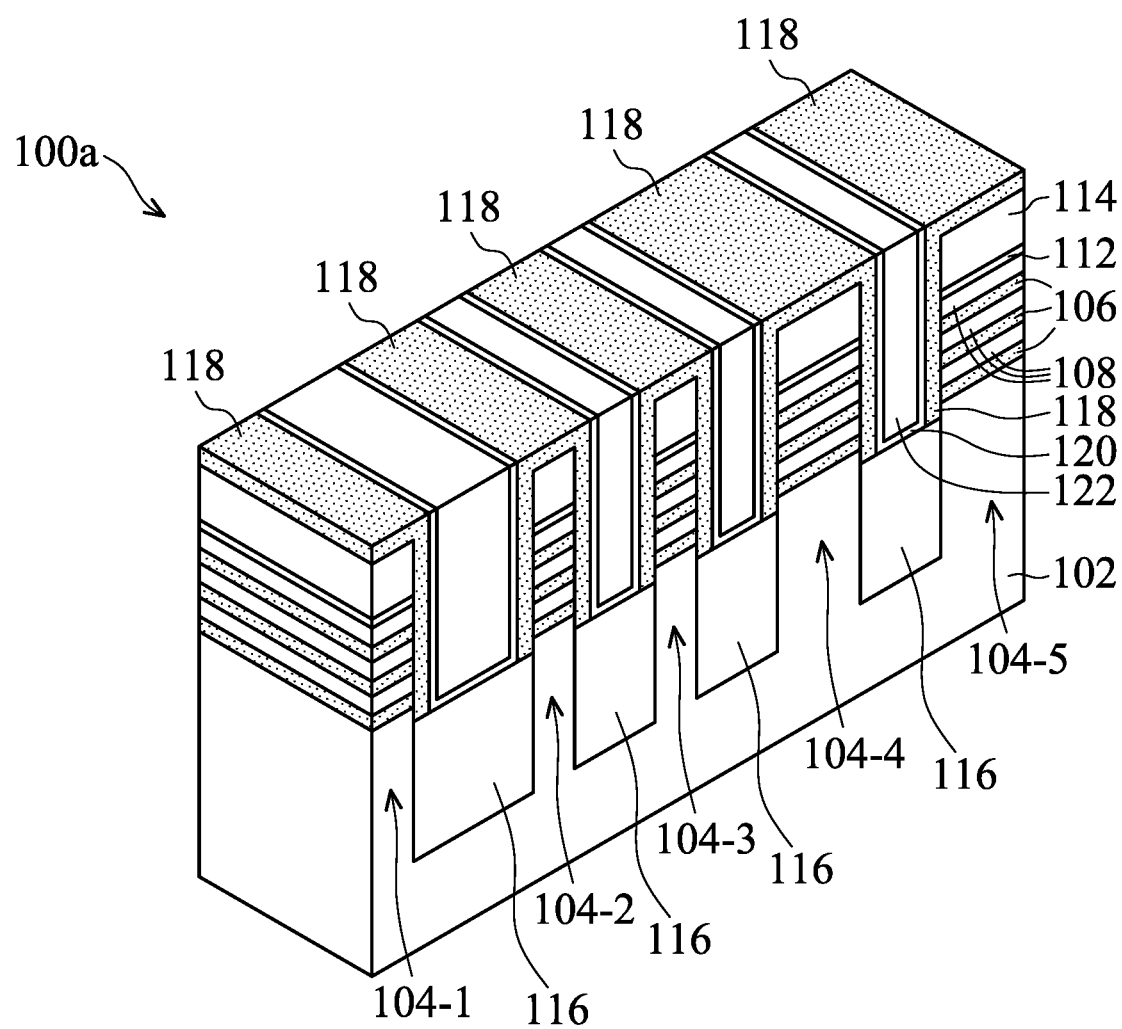
Figure 2F:
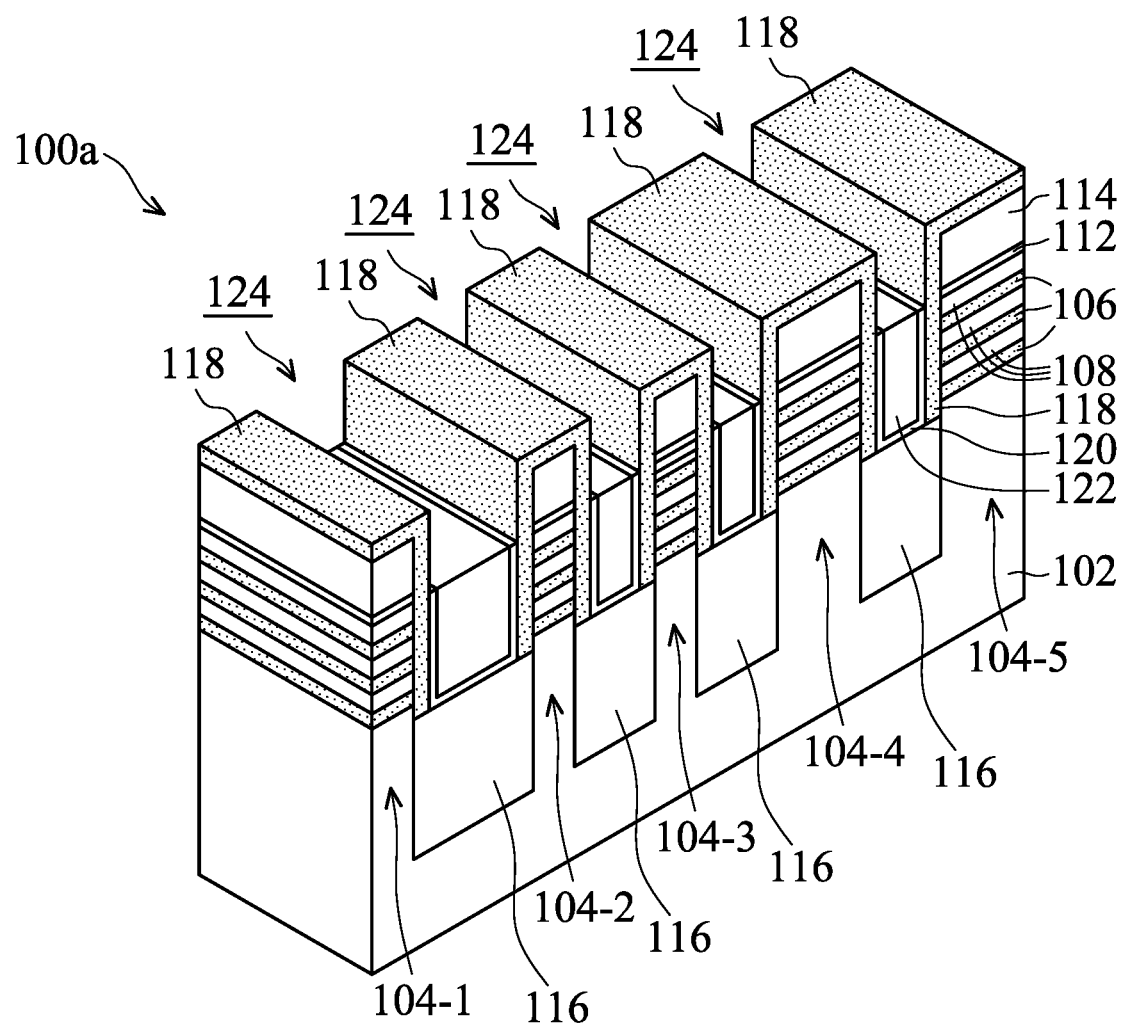
Figure 2G:
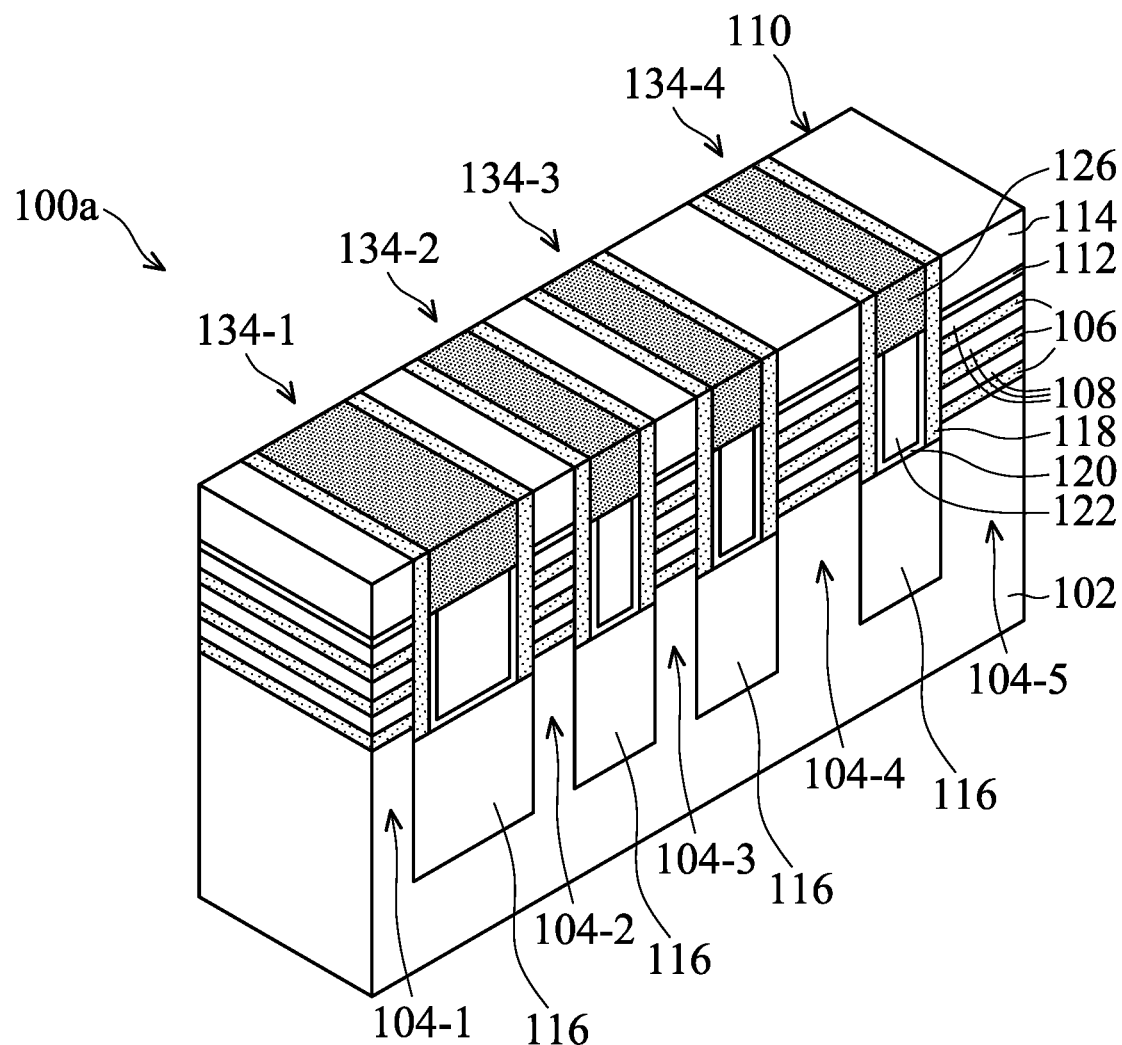
Figure 2H:
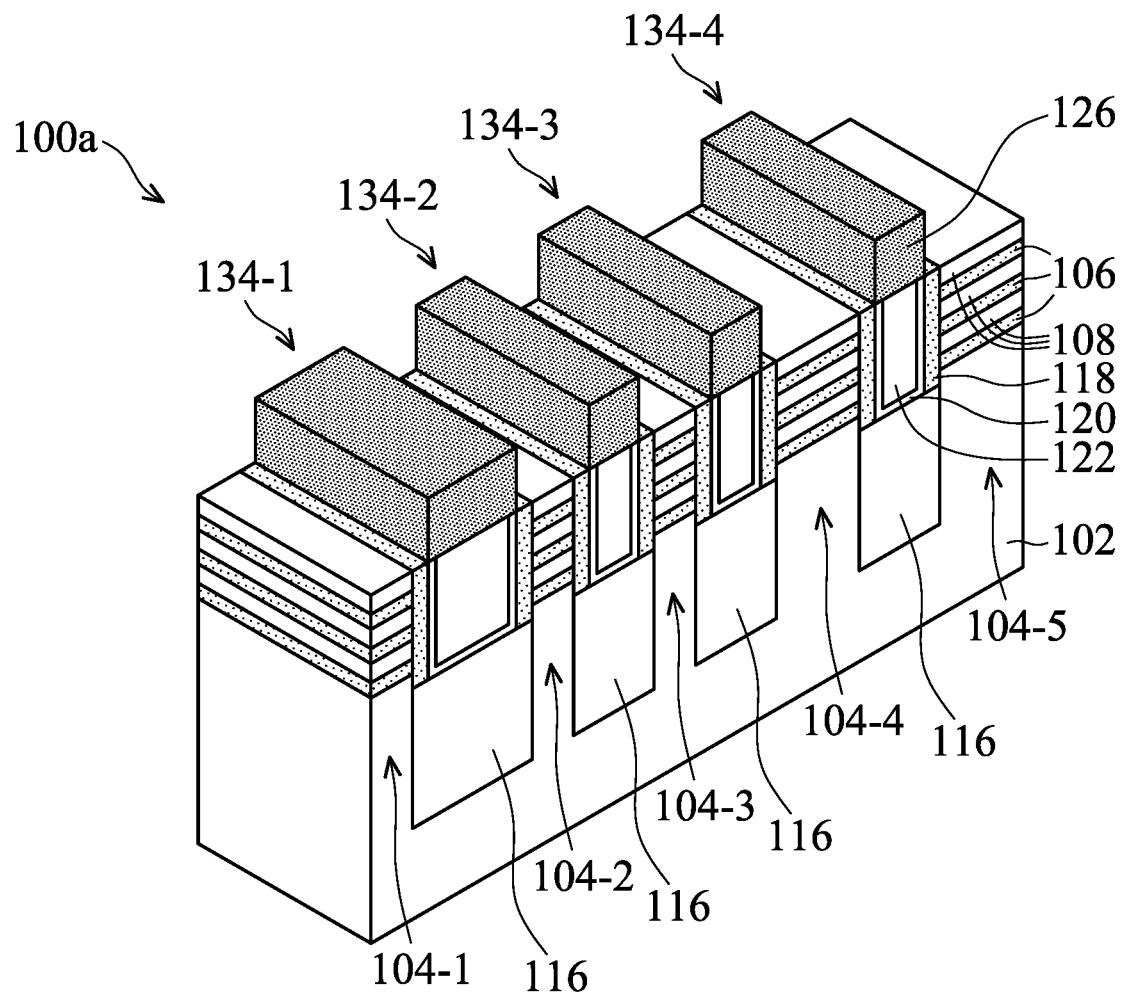
Figure 2I:
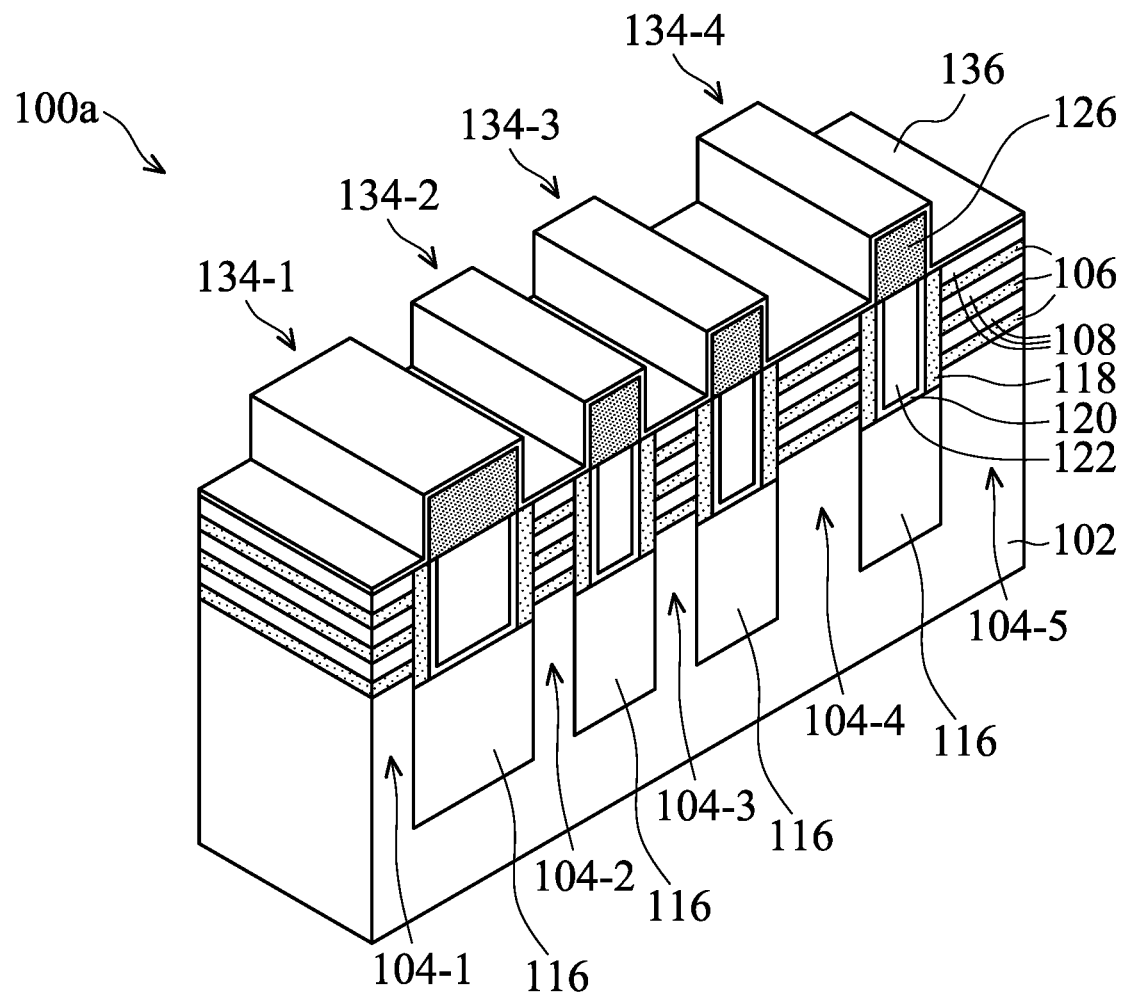
Figure 2J:
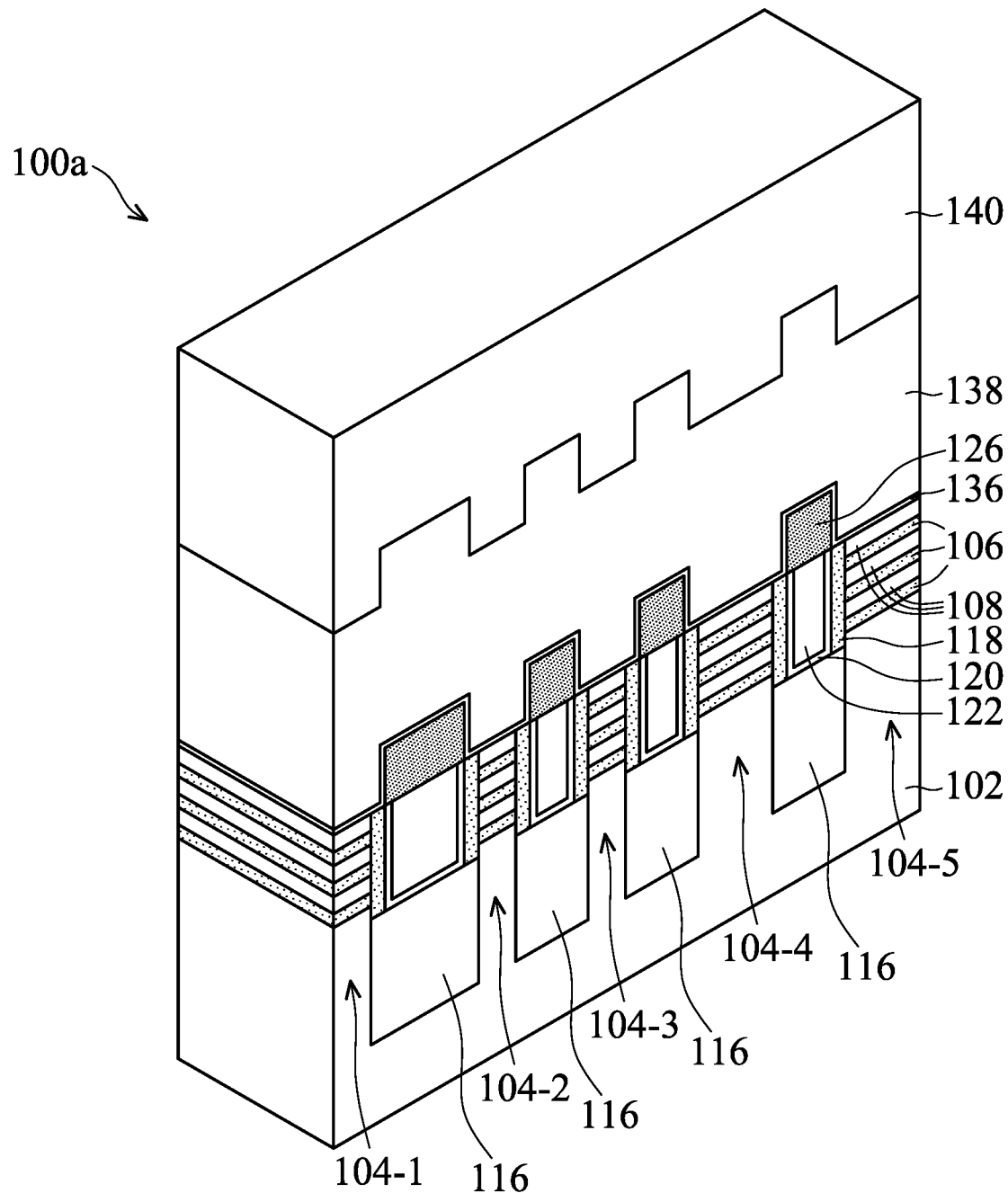
Figure 2K:
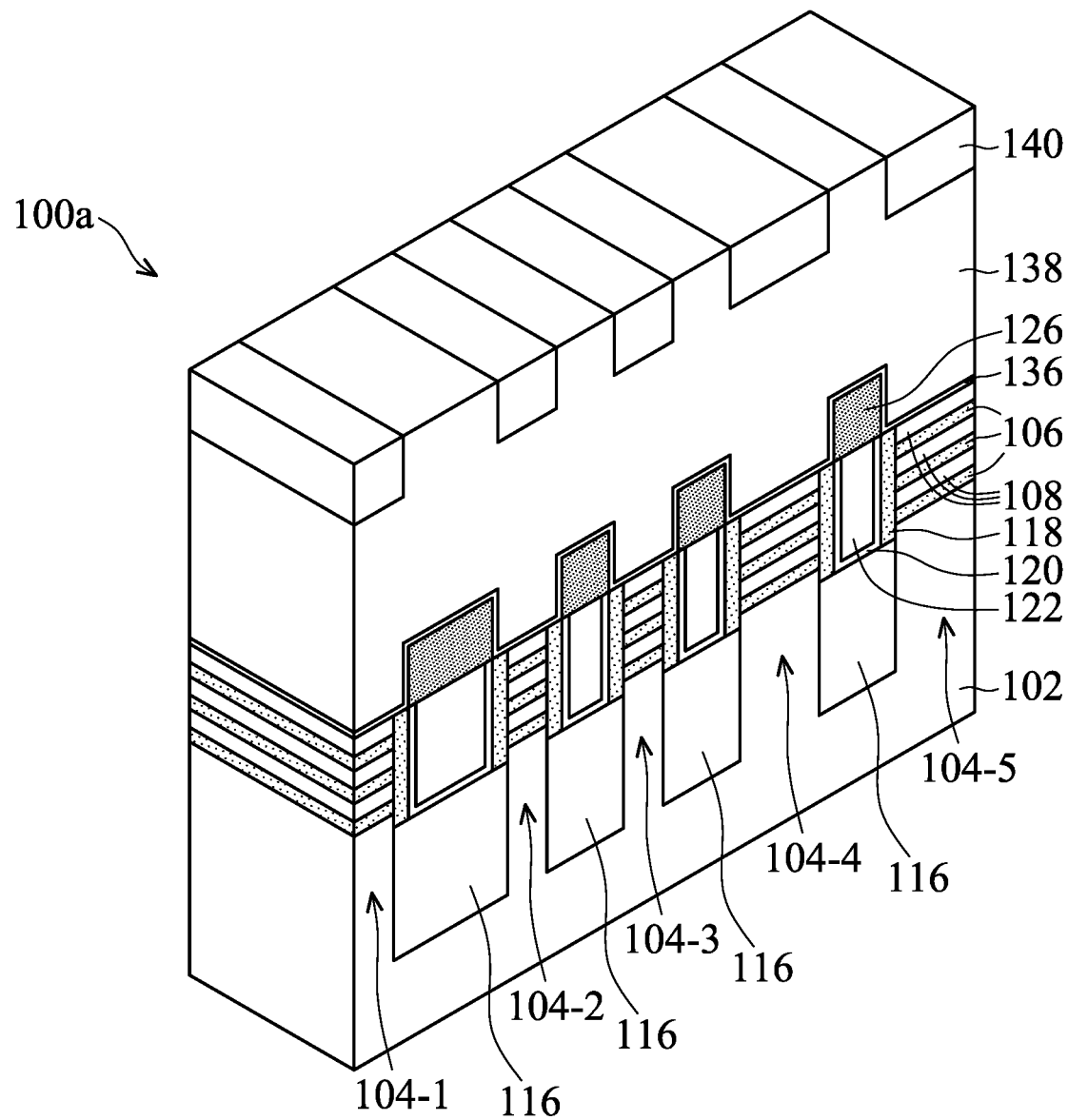
Figure 2L:
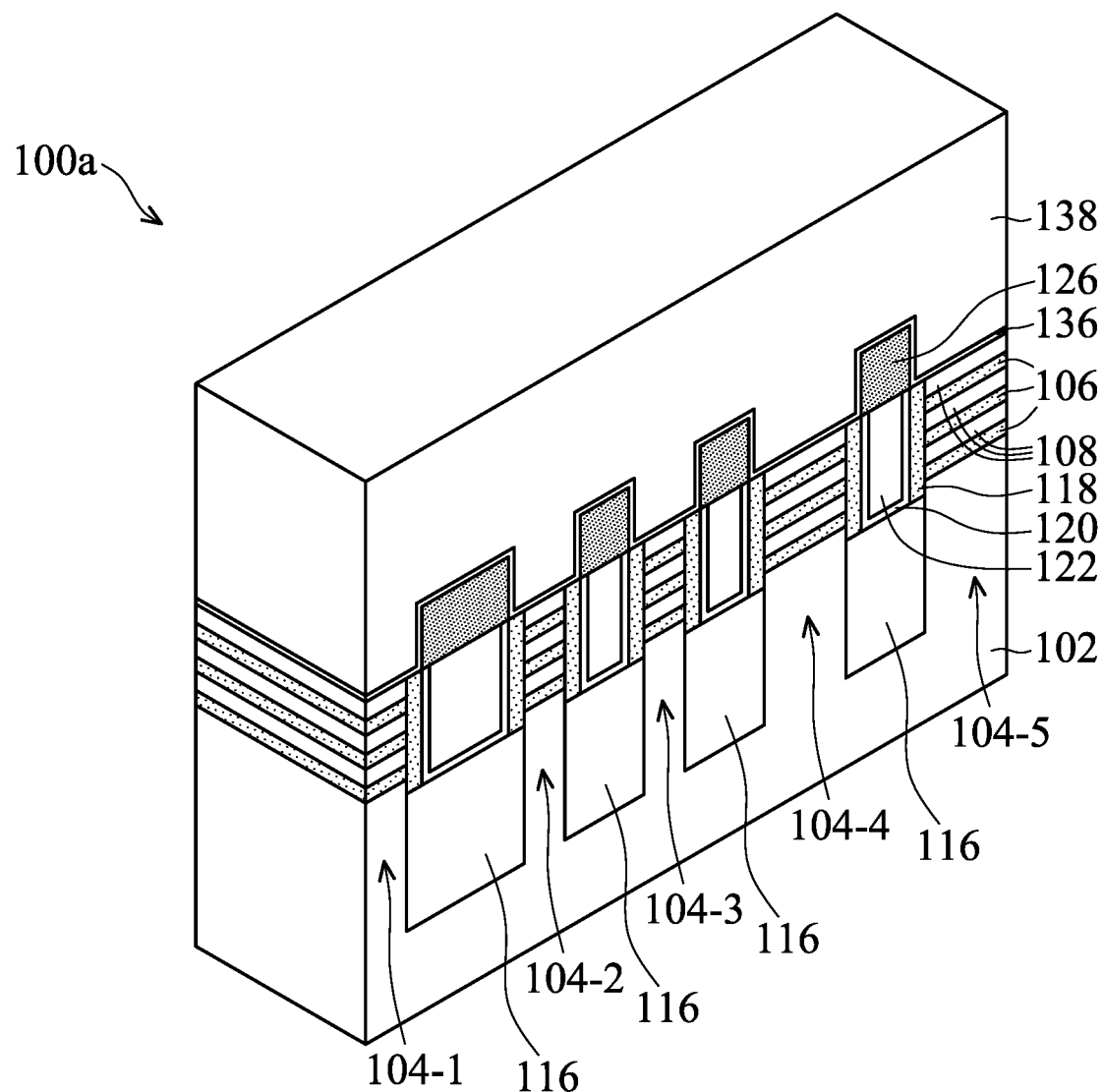
Figure 2M:
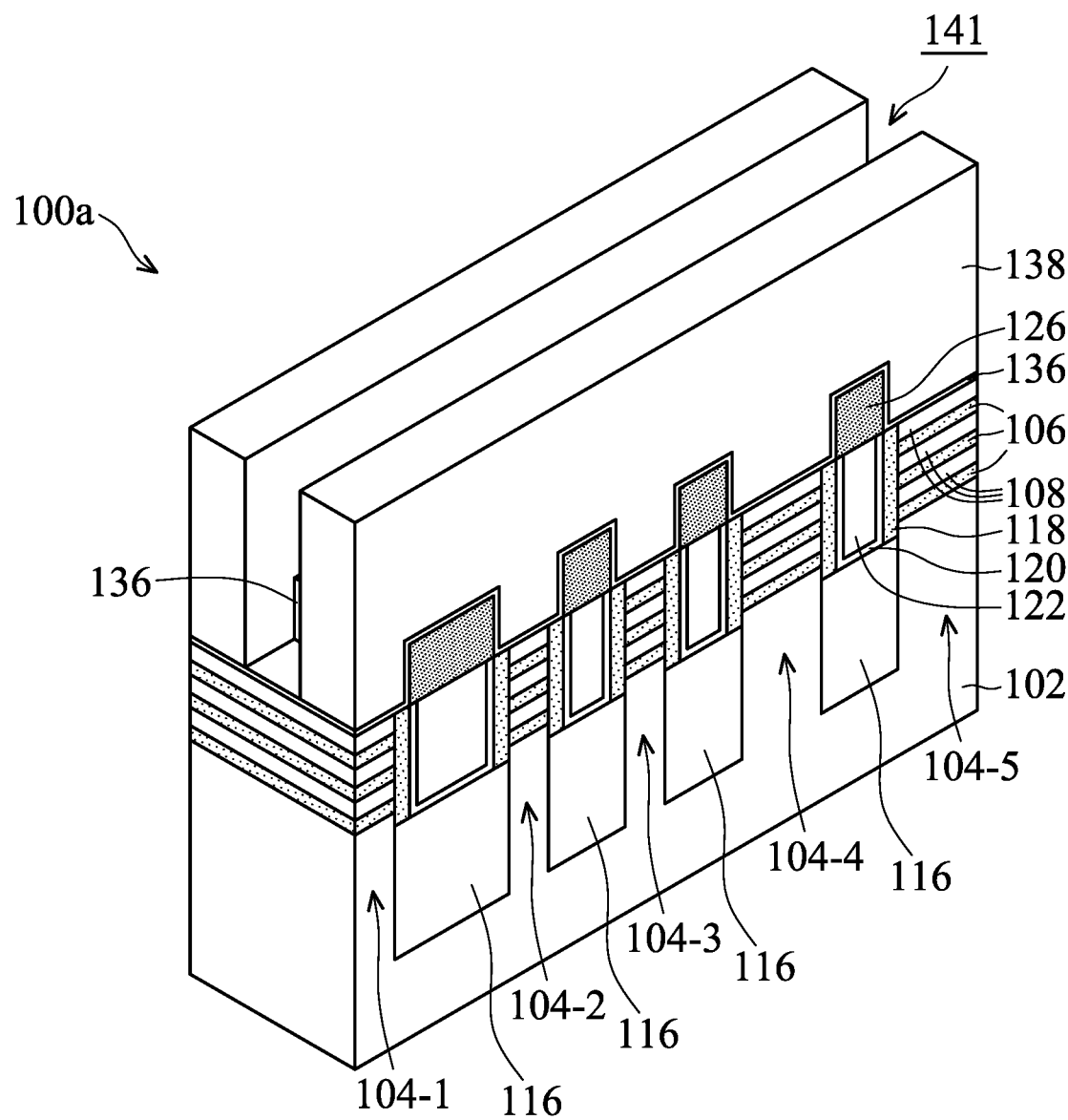
Figure 2N:
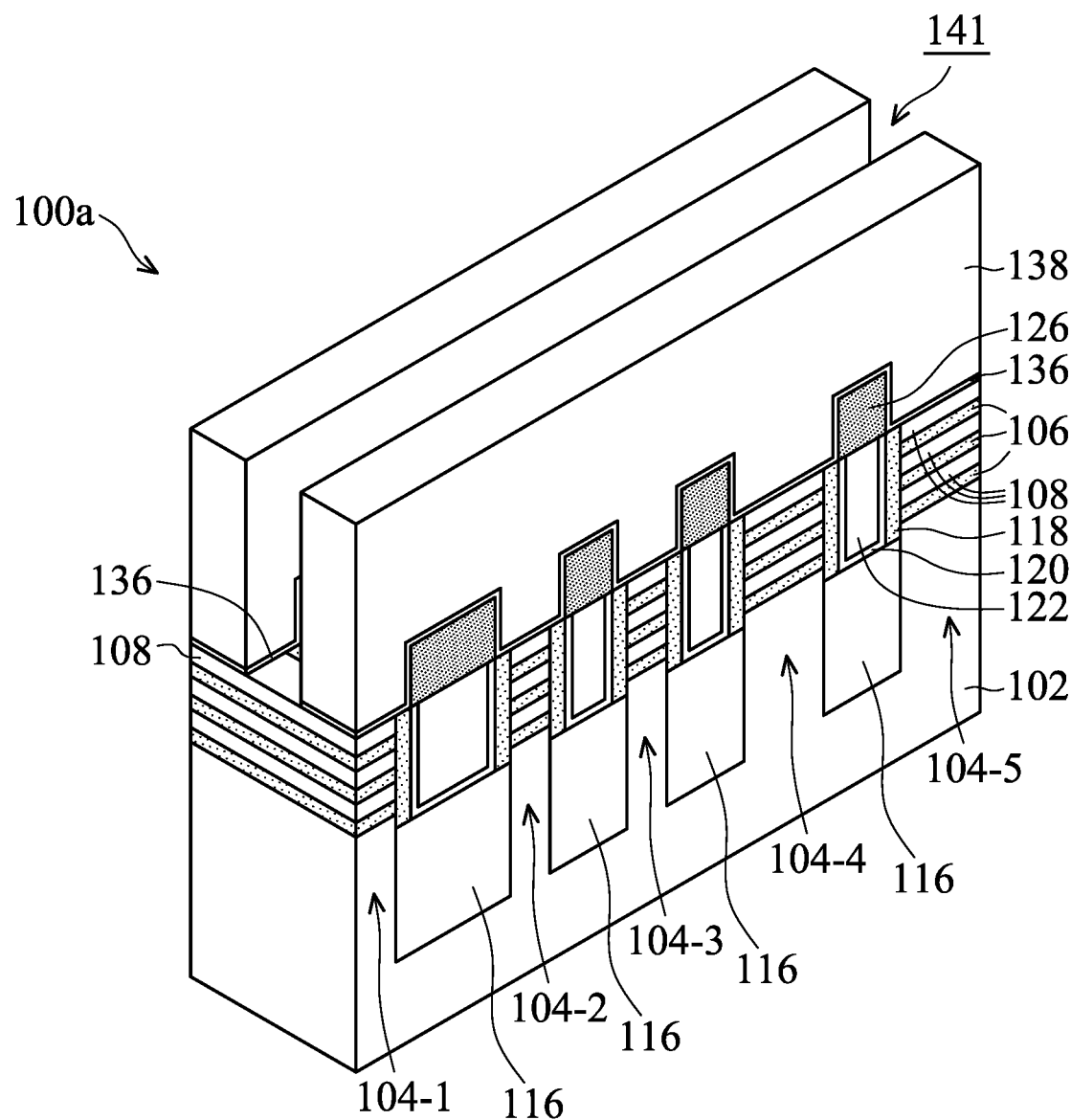
Figure 2O:
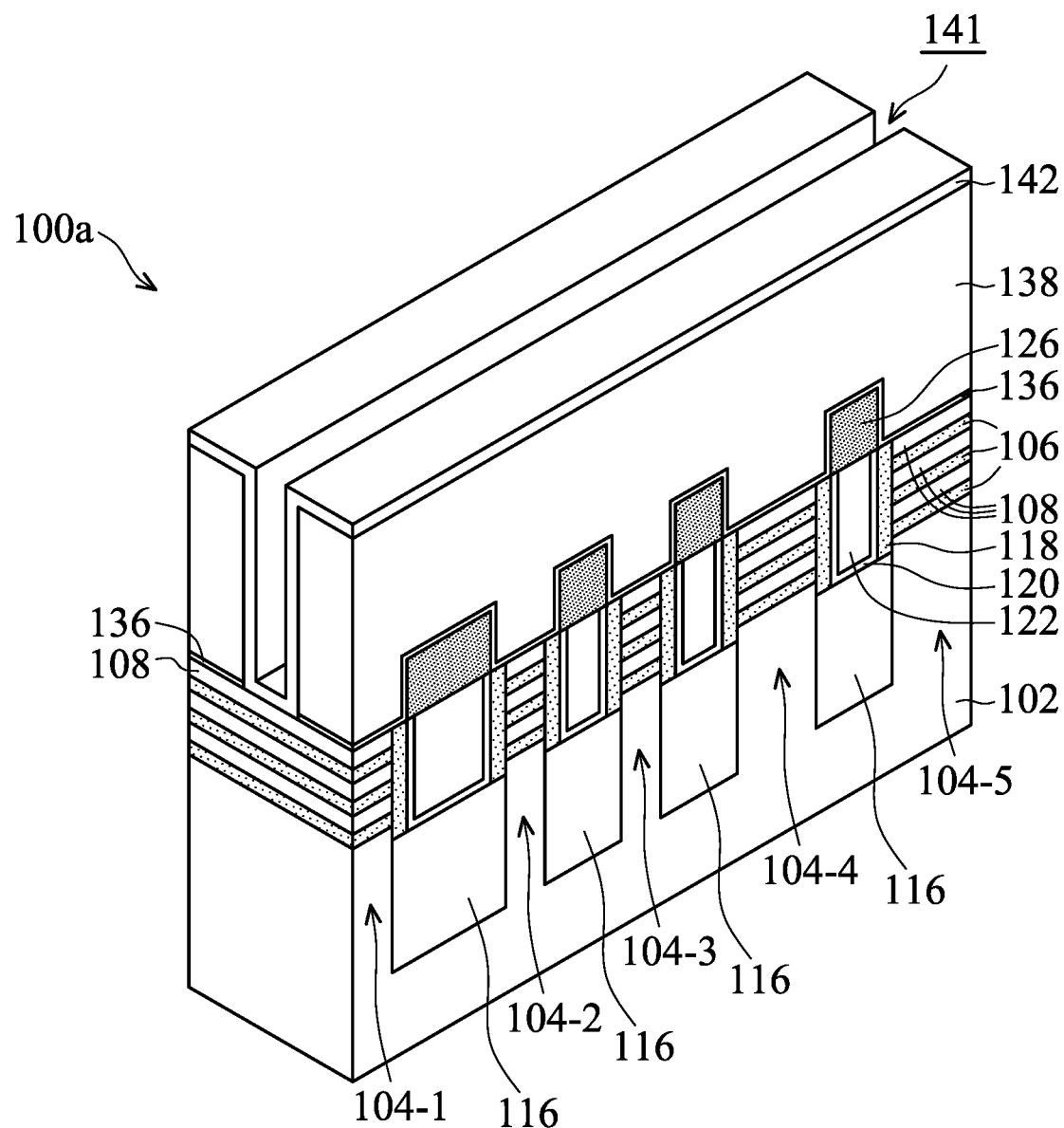
Figure 2P:
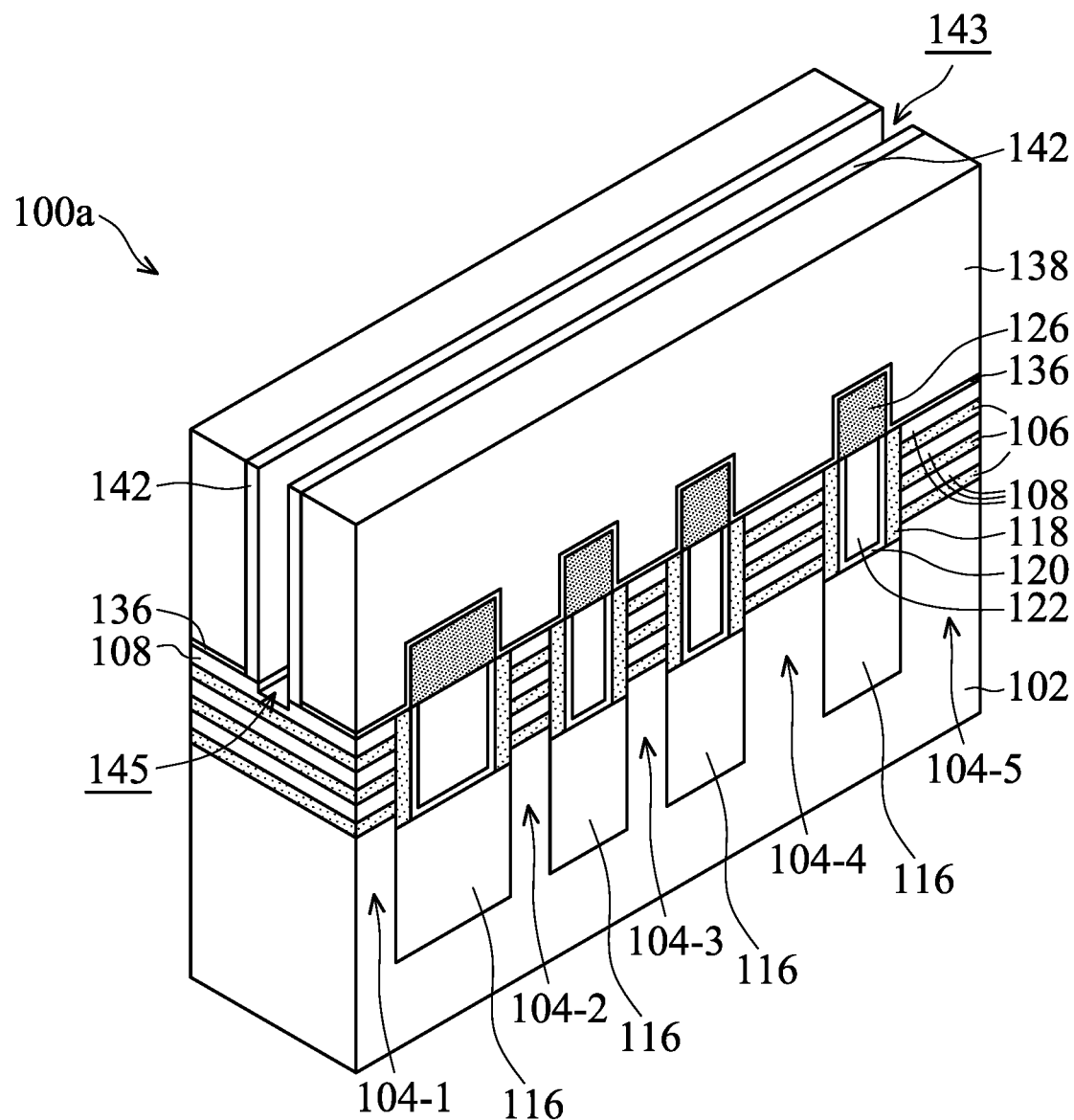
Figure 2Q:
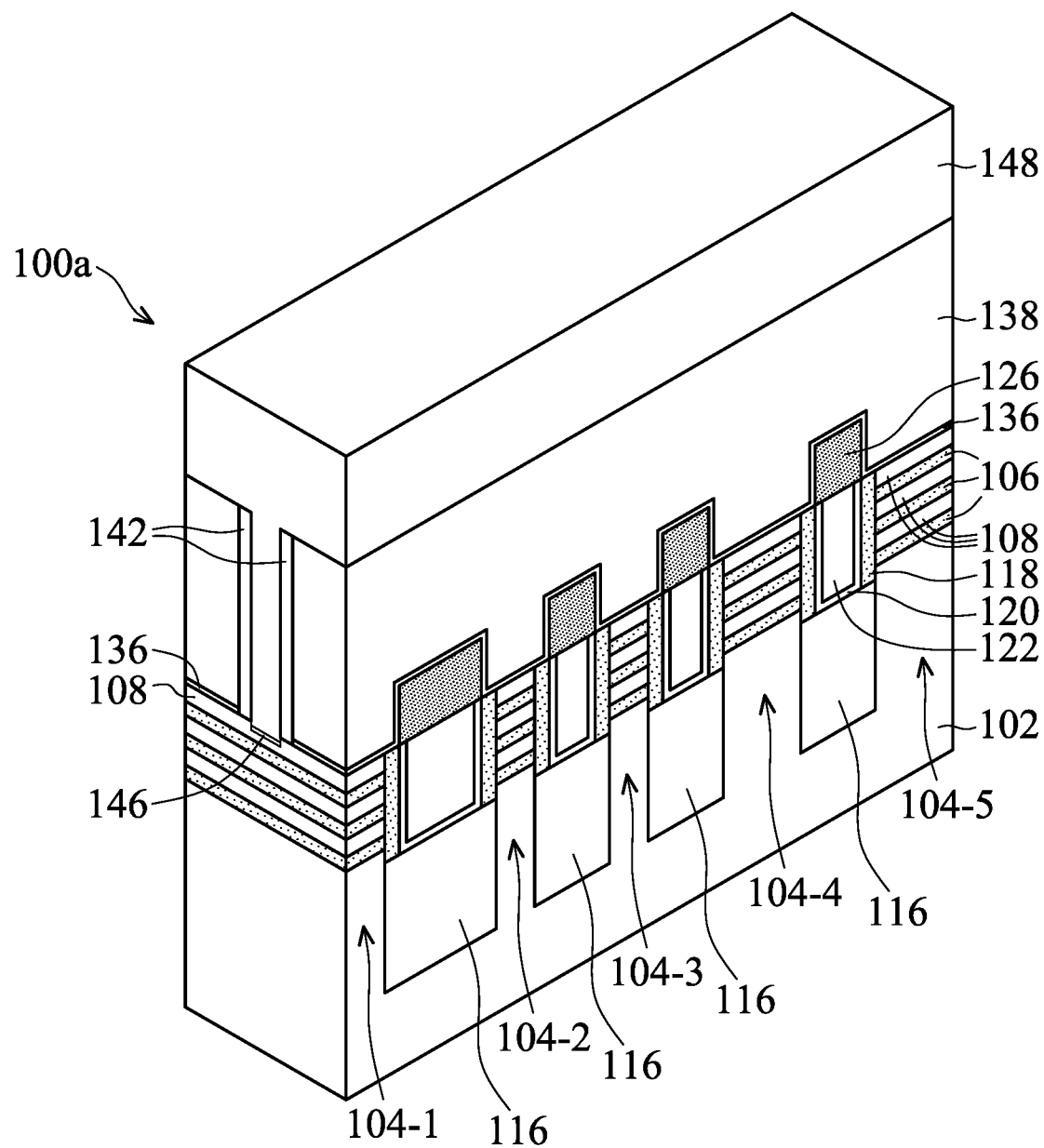
Figure 2R:
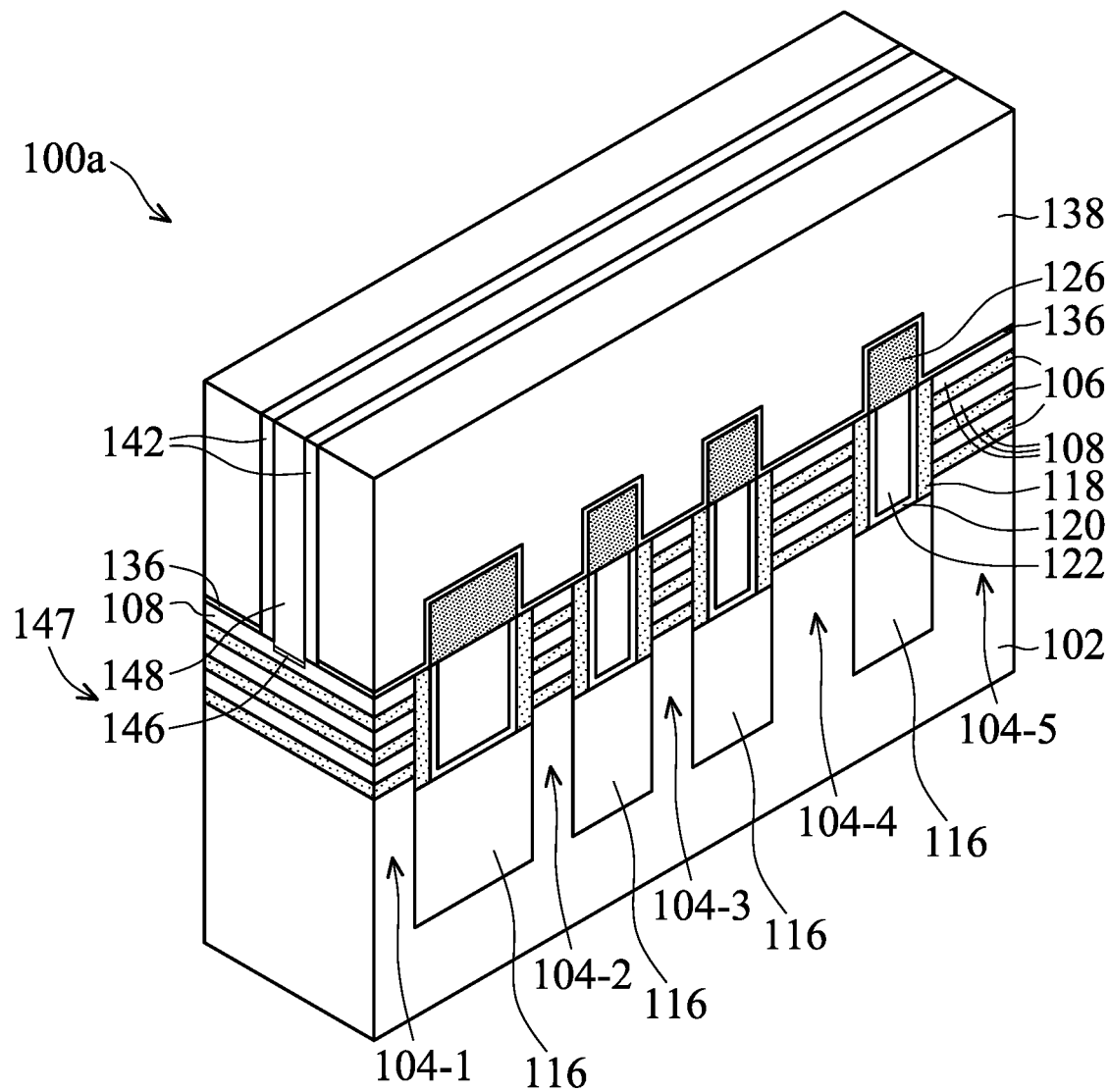
Figure 2S:
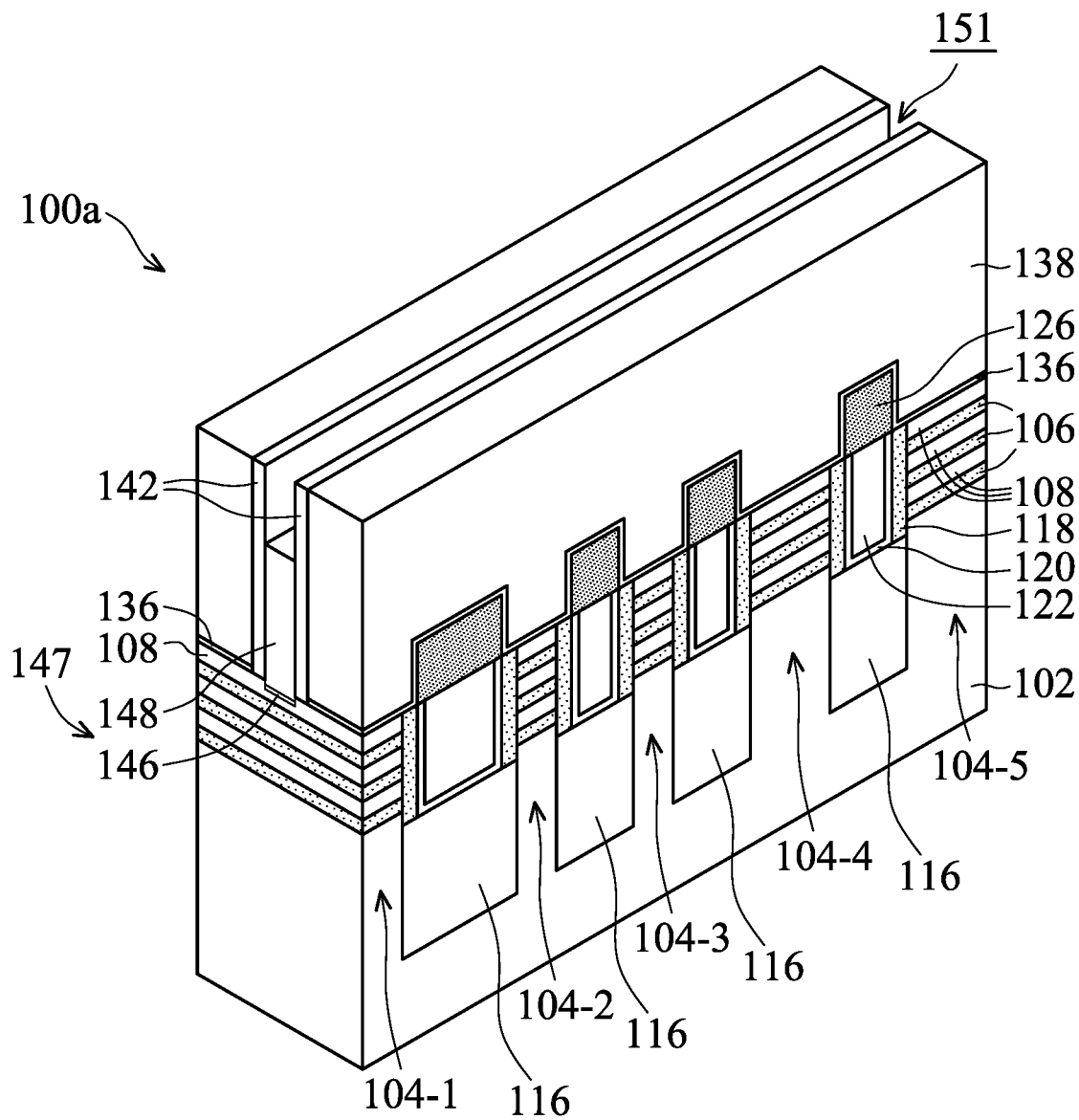
Figure 2T:
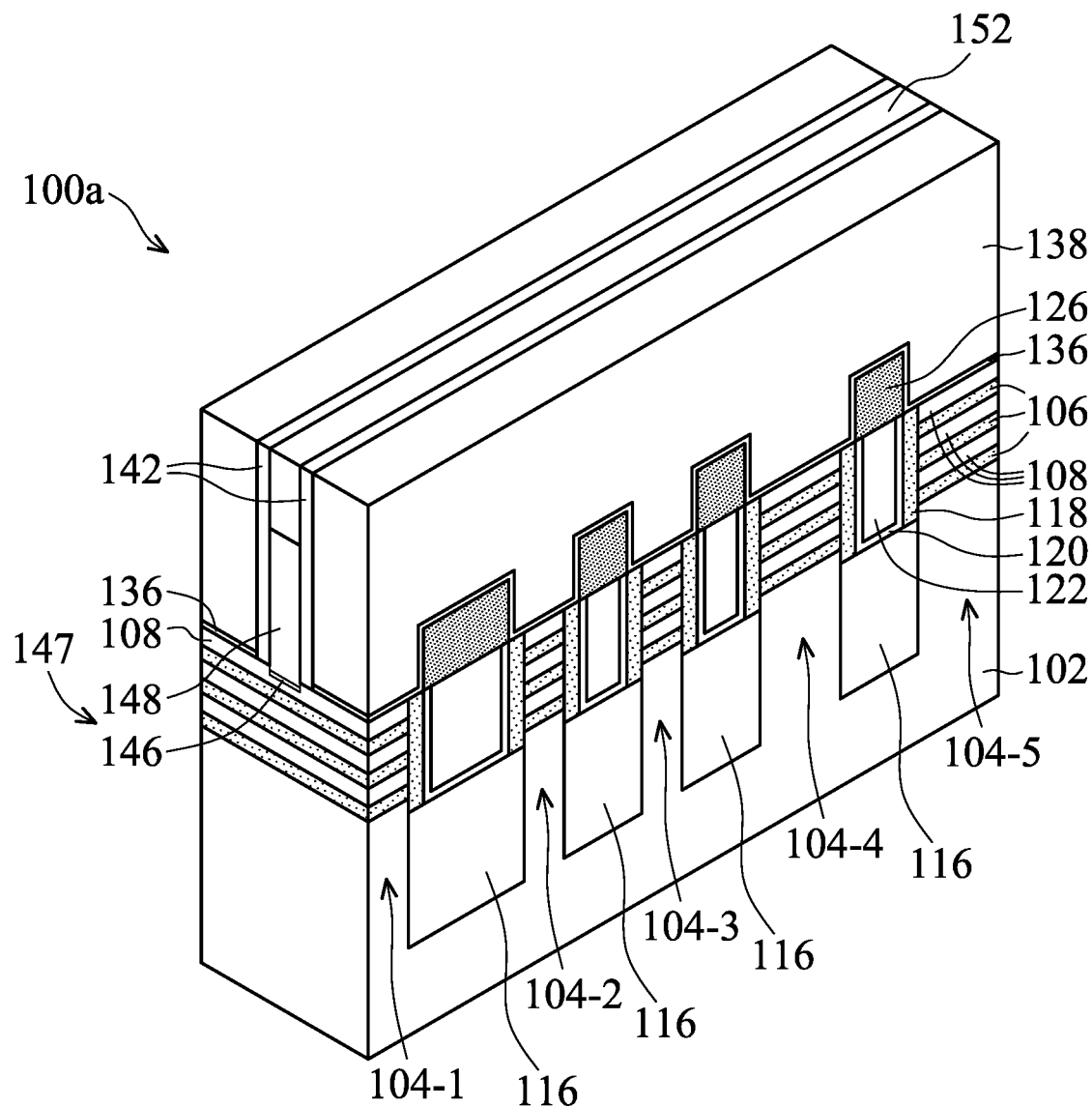
Figure 2U:
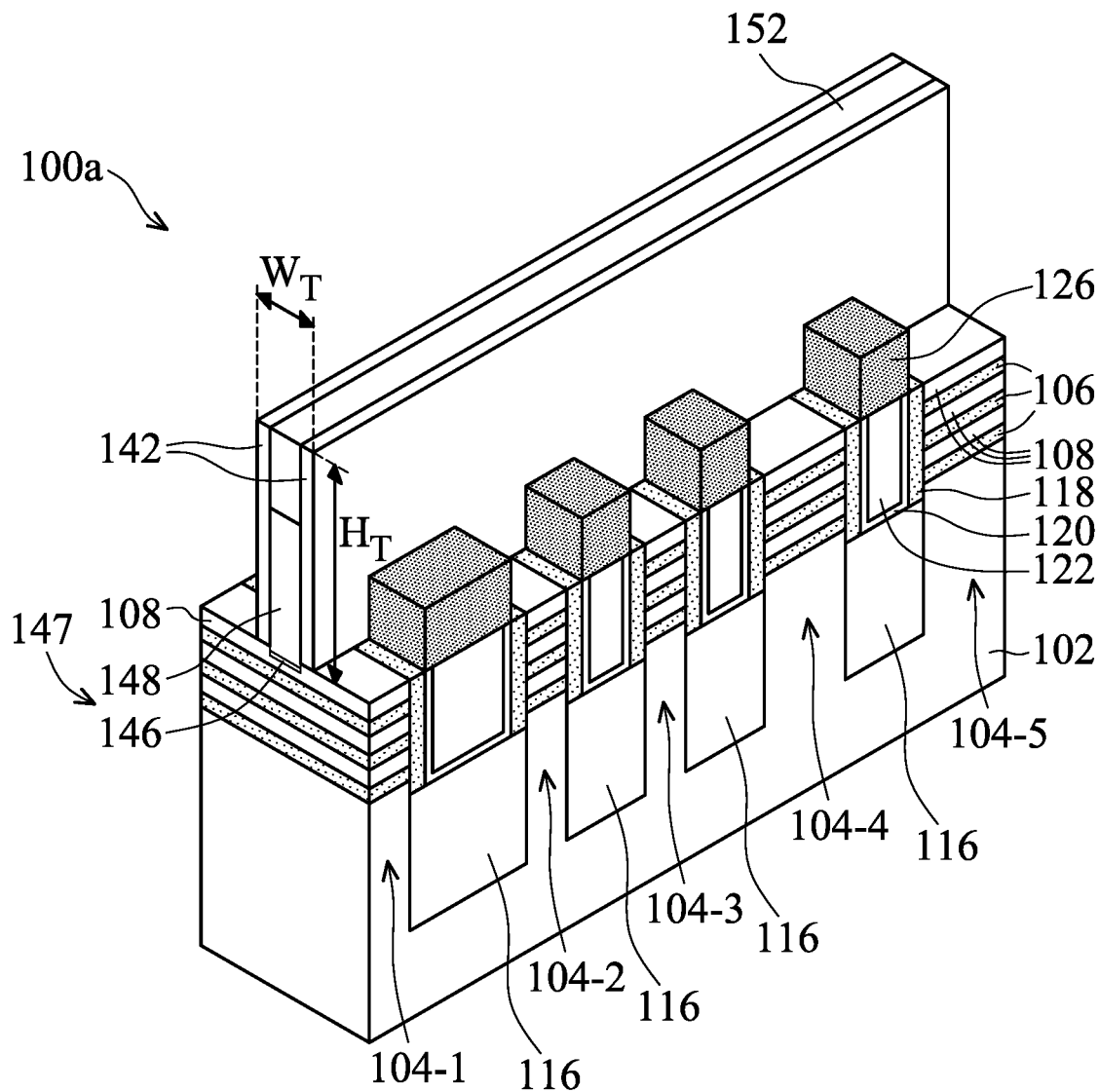
Figure 2V:
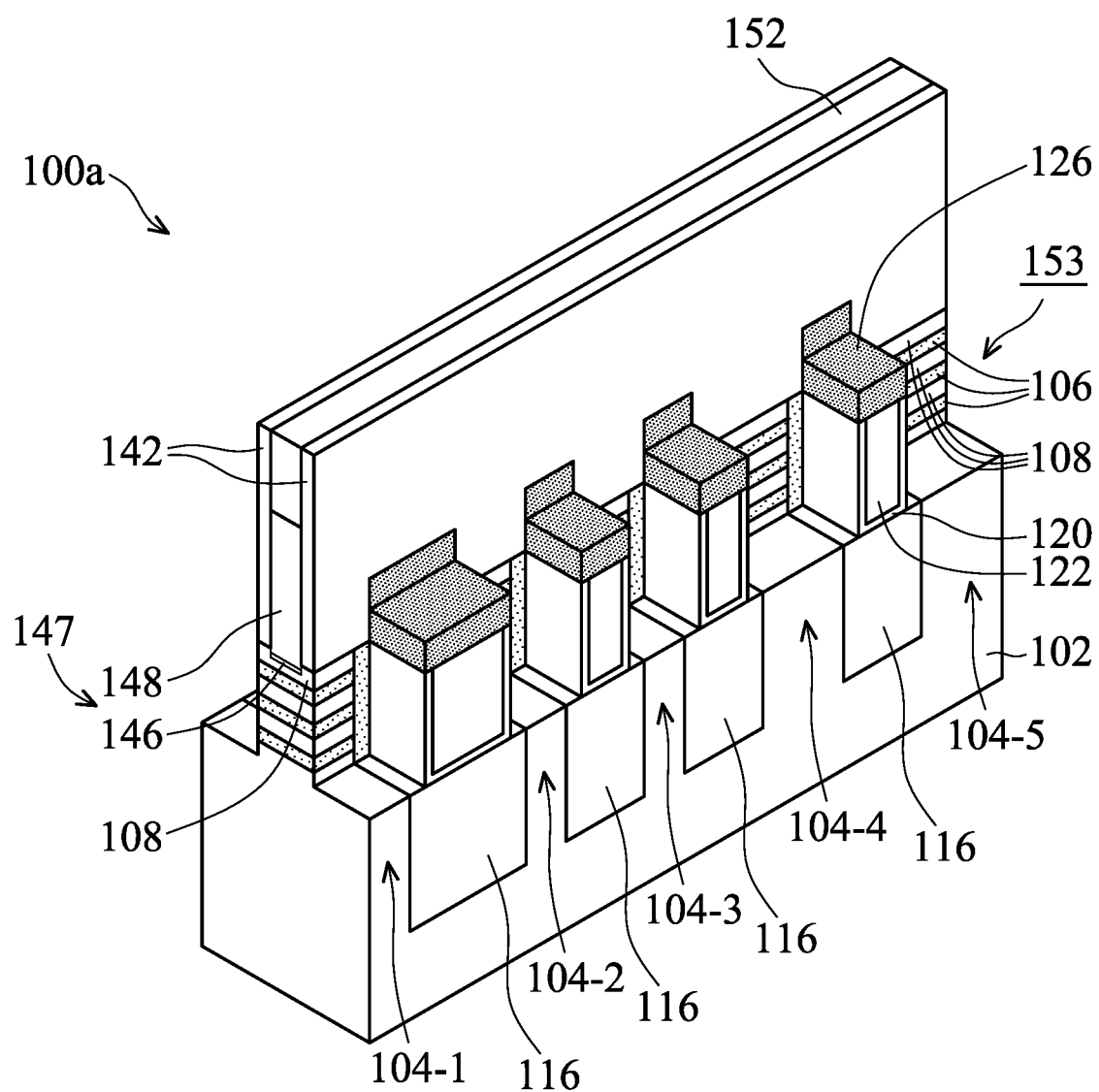
Figure 2W:
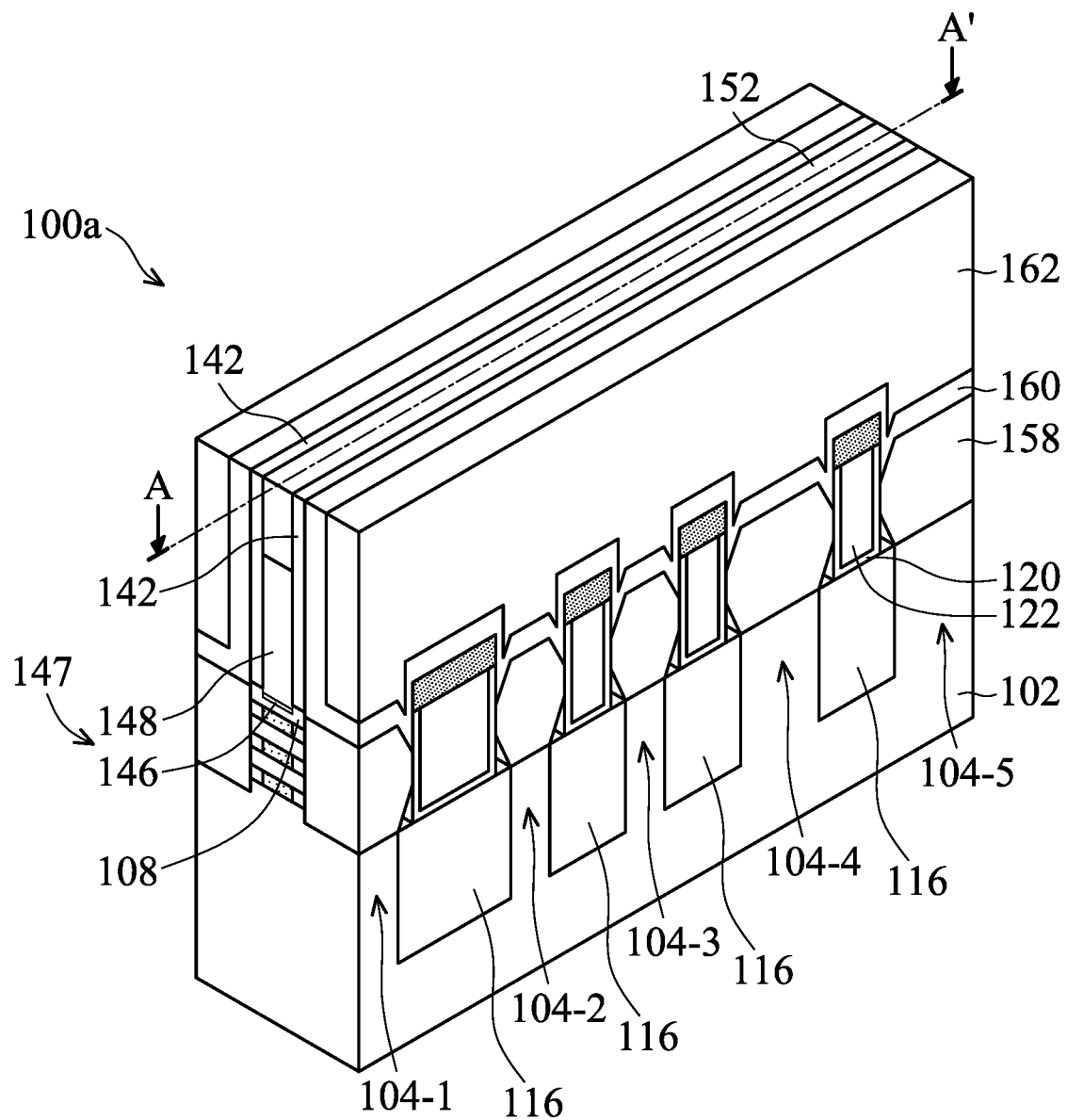

FIGS. 2A to 2W illustrate perspective views of intermediate stages of manufacturing a semiconductor structure 100a in accordance with some embodiments. More specifically, FIGS. 2A to 2W illustrate diagrammatic perspective views of intermediate stages of manufacturing the semiconductor structure 100a shown in FIG. 1.

As shown in FIG. 2A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 106 and a number of second semiconductor layers 108 are sequentially alternately formed over the substrate 102. The first semiconductor layers 106 and the second semiconductor layers 108 are vertically stacked to form a stacked nanostructures structure (or a stacked nanosheet or a stacked nanowire).

In some embodiments, the first semiconductor layers 106 and the second semiconductor layers 108 independently include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 106 and the second semiconductor layer 108 are made of different materials.

The first semiconductor layers 106 and the second semiconductor layers 108 are made of different materials having different lattice constant. In some embodiments, the first semiconductor layer 106 is made of silicon germanium ($Si_{1-x}Ge_x$, $0.1<x<0.7$), and the second semiconductor layer 108 is made of silicon (Si). In some other embodiments, the first semiconductor layer 106 is made of silicon (Si), and the second semiconductor layer 108 is made of silicon germanium ($Si_{1-x}Ge_x$, $0.1<x<0.7$).

In some embodiments, the first semiconductor layers 106 and the second semiconductor layers 108 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 106 and the second semiconductor layers 108 are formed in-situ in the same chamber.

In some embodiments, the thickness of each of the first semiconductor layers 106 is in a range from about 5 nanometers (nm) to about 10 nm. Terms such as "about" in conjunction with a specific distance or size are to be interpreted as not to exclude insignificant deviation from the specified distance or size and may include for example deviations of up to 20%. In some embodiments, the first semiconductor layers 106 are substantially uniform in thickness. In some embodiments, the thickness of each of the second semiconductor layers 108 is in a range from about 5 nm to about 10 nm. In some embodiments, the second semiconductor layers 108 are substantially uniform in thickness.

Then, as shown in FIG. 2B, the first semiconductor layers 106 and the second semiconductor layers 108 are patterned to form fin structures 104-1, 104-2, 104-3, 104-4, 104-5, in accordance with some embodiments of the disclosure. In some embodiments, the fin structures 104-1, 104-2, 104-3, 104-4, 104-5, include base fin structures 105 and the semiconductor material stacks, including the first semiconductor layers 106 and the second semiconductor layers 108, formed over the base fin structure 105. In some embodiments, each of the fin structures 104-1, 104-2, 104-3, 104-4, 104-5 has different widths along the horizontal direction.

In some embodiments, the patterning process includes forming mask structures 110 over the semiconductor material stack, and etching the semiconductor material stack and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD).

Afterwards, as shown in FIG. 2C, a liner (not shown) is formed to cover the fin structures 104-1, 104-2, 104-3, 104-4, 104-5, and an insulating layer (not shown) is formed around the fin structures 104-1, 104-2, 104-3, 104-4, 104-5 over the liner, in accordance with some embodiments of the disclosure. In some embodiments, the liner is made of an oxide and a nitride. In some embodiments, the liner is omitted. In some embodiments, the insulating layer is made of silicon oxide, silicon nitride, silicon oxynitride (SiON), another suitable insulating material, or a combination thereof.

Afterwards, the insulating layer and the liner are recessed to form an isolation structure 116, in accordance with some embodiments. The isolation structure 116 is configured to electrically isolate active regions (e.g. the fin structures 104-1 and 104-2) of the semiconductor structure and is also referred to as shallow trench isolation (STI) feature in accordance with some embodiments.

Afterwards, as shown in FIG. 2D, the isolation structure 116 is formed, cladding layers 118 are formed over the top surfaces and the sidewalls of the fin structures 104-1 and 104-2 over the isolation structure 116, in accordance with some embodiments. In some embodiments, the cladding layers 118 are made of semiconductor materials. In some embodiments, the cladding layers 118 are made of silicon germanium (SiGe). In some embodiments, the cladding layers 118 and the first semiconductor layers 106 are made of the same semiconductor material.

The cladding layer 118 may be formed by performing an epitaxy process, such as VPE and/or UHV CVD, molecular beam epitaxy, other applicable epitaxial growth processes, or combinations thereof. After the cladding layers 118 are deposited, an etching process may be performed to remove the portion of the cladding layer 118 not formed on the sidewalls of the fin structures 104-1, 104-2, 104-3, 104-4, 104-5, for example, using a plasma dry etching process. In some embodiments, the portions of the cladding layers 118 formed on the top surface of the fin structures 104-1, 104-2, 104-3, 104-4, 104-5 are partially or completely removed by the etching process, such that the thickness of the cladding layer 118 over the top surface of the fin structures 104-1, 104-2, 104-3, 104-4, 104-5 is thinner than the thickness of the cladding layer 118 on the sidewalls of the fin structures 104-1, 104-2, 104-3, 104-4, 104-5.

Before the cladding layers 118 are formed, a semiconductor liner (not shown) may be formed over the fin structures 104-1, 104-2, 104-3, 104-4, 104-5. The semiconductor liner may be a Si layer and may be incorporated into the cladding layers 118 during the epitaxial growth process for forming the cladding layers 118.

Next, as shown in FIG. 2E, a liner layer 120 and a filling layer 122 are sequentially formed over the cladding layers 118 and the isolation structure 116, in accordance with some embodiments. In some embodiments, the liner layer 120 is made of a low k dielectric material having a k value lower than 7. In some embodiments, the liner layer 120 is made of SiN, SiCN, SiOCN, SiON, or the like. The liner layer 120 may be deposited using CVD, PVD, ALD, HDPCVD, MOCVD, RPCVD, PECVD, LPCVD, ALCVD, APCVD, other applicable methods, or combinations thereof. In some embodiments, the liner layer 120 has a thickness in a range from about 2 nm to about 8 nm.

After the liner layer 120 is formed, the filling layer 122 is formed over the liner layer 120 to completely fill the spaces between the adjacent fin structures 104-1 and 104-2, and a polishing process is performed until the top surfaces of the cladding layers 118 are exposed, in accordance with some embodiments.

In some embodiments, the filling layer 122 and the liner layer 120 are both made of oxide but are formed by different methods. In some embodiments, the filling layer 122 is made of SiN, SiCN, SiOCN, SiON, or the like. The filling layer 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, as shown in FIG. 2F, recesses 124 are formed between the fin structures 104-1 and 104-2, in accordance with some embodiments. In some embodiments, the filling layer 122 and the liner layer 120 are recessed by performing an etching process. In some embodiments, the filling layer 122 are formed using a flowable CVD process, so that the resulting filling layer 122 can have a relatively flat top surface after the etching process is performed.

Afterwards, as shown in FIG. 2G, a cap layer 126 is formed in the recesses 124, thereby forming dielectric features 134, in accordance with some embodiments. In some embodiments, the dielectric features 134 include dielectric features 134-1, 134-2, 134-3, 134-4 at opposite sides of the fin structures 104-1 and 104-2. In some embodiments, each of the dielectric features 134-1, 134-2, 134-3, 134-4 has different width along the horizontal direction.

In some embodiments, the cap layer 126 is made of a high k dielectric material, such as $HfO_2$, $ZrO_2$, $HfAlO_x$, $HfSiO_x$, $Al_2O_3$, or the like. The dielectric materials for forming the cap layer 126 may be formed by performing ALD, CVD, PVD, oxidation-based deposition process, other suitable process, or combinations thereof. After the cap layers 126 are formed, a CMP process is performed until the mask structures 110 are exposed in accordance with some embodiments. The cap layers 126 should be thick enough to protect the dielectric features 134 during the subsequent etching processes, so that the dielectric features 134 may be used to separate the adjacent source/drain structures formed afterwards.

Next, as shown in FIG. 2H, the mask structures 110 over the fin structures 104-1, 104-2, 104-3, 104-4, 104-5 and the top portions of the cladding layers 118 are removed to expose the top surfaces of the topmost second semiconductor material layers 108, in accordance with some embodiments. In some embodiments, the top surfaces of the cladding layers 118 are substantially level with the top surfaces of the topmost second semiconductor layers 108.

The mask structures 110 and the cladding layers 118 may be recessed by performing one or more etching processes that have higher etching rate to the mask structures 110 and the cladding layers 118 than the dielectric features 134, such that the dielectric features 134 are only slightly etched during the etching processes. The selective etching processes can be dry etching, wet drying, reactive ion etching, or other applicable etching methods.

Afterwards, as shown in FIG. 2I, a first oxide layer 136 is formed over the cap layer 126, and the topmost second semiconductor layer 108 and the cladding layer 118, in accordance with some embodiments. The first oxide layer 136 is conformally formed on the cap layer 126, and therefore the spaces between two adjacent cap layers 126 that are not filled with the first oxide layer 136.

In some embodiments, the first oxide layer 136 is made of silicon oxide or another applicable material. In some embodiments, the first oxide layer 136 is formed by a deposition process, such as CVD process, ALD process, another applicable process, or a combination thereof.

Afterwards, as shown in FIG. 2J, a first hard mask layer 138 is formed over the first oxide layer 136, and a second oxide layer 140 is formed over the first hard mask layer 138, in accordance with some embodiments. In addition, the first hard mask layer 138 is filled into the spaces between two adjacent cap layers 126 are not filled with the first oxide layer 136. The first hard mask layer 138 has a number of protruding portions, and therefore the first hard mask layer 138 has a non-planar top surface. In order to reduce the height difference, the second oxide layer 140 is formed over the first hard mask layer 138. As a result, the second oxide layer 140 has a substantially planar top surface.

The first oxide layer 136 and the first hard mask layer 138 are made of different materials. The first oxide layer 136 has a high etching selectivity with respect to the first hard mask layer 138. In some embodiments, the first hard mask layer 138 is removed while the first oxide layer 136 is remaining due to the etching selectivity between them. In some embodiments, the first hard mask layer 138 is made of silicon nitride, silicon oxynitride, or another applicable material. In some embodiments, the first hard mask layer 138 is formed by a deposition process, such as CVD process, ALD process, another applicable process, or a combination thereof.

Afterwards, as shown in FIG. 2K, a portion of the second oxide layer 140 is removed to expose the top surface of the first hard mask layer 138, in accordance with some embodiments. In some embodiments, the portion of the second oxide layer 140 is removed by a planarizing process, such as a chemical mechanical polishing (CMP) process.

The second oxide layer 140 and the first oxide layer 136 are made of the same or different material. In some embodiments, the second oxide layer 140 is made of silicon oxide or another applicable material. In some embodiments, the second oxide layer 140 is formed by a deposition process, such as CVD process, ALD process, another applicable process, or a combination thereof.

Afterwards, as shown in FIG. 2L, the remaining second oxide layer 140 is removed, and then the protruding portions of the first hard mask layer 138 are removed, in accordance with some embodiments. As a result, the first hard mask layer 138 has a planar top surface. In some embodiments, the remaining second oxide layer 140 is removed, and then the protruding portions of the first hard mask layer 138 are removed by a planarizing process, such a chemical mechanical polishing (CMP) process. The height of the dummy gate electrode layer 148 (formed later, in FIG. 2Q) is determined by controlling the height of the remaining first hard mask layer 138.

Afterwards, as shown in FIG. 2M, a portion of the first hard mask layer 138 is removed to form a first trench 141, in accordance with some embodiments. In addition, the first oxide layer 136 is exposed by the first trench 141. Since the first oxide layer 136 has a high etching selectivity with respect to the first hard mask layer 138, the first oxide layer 136 is not removed while the first hard mask layer 138 is removed. The first oxide layer 136 is used as an etching stop layer at the step of FIG. 2M.

The portion of the first hard mask layer 138 is removed by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

Afterwards, as shown in FIG. 2N, the exposed first oxide layer 136 is removed to expose the cap layer 126 and the topmost second semiconductor layer 108, in accordance with some embodiments. In some embodiments, the exposed first oxide layer 136 is removed by an etching process, such as a dry etching process or a wet etching process. Note that another portion of the first oxide layer 136 which is covered by the first hard mask layer 138 is not removed.

Afterwards, as shown in FIG. 2O, a gate spacer layer 142 is formed in the first trench 141, in accordance with some embodiments. The gate spacer layer 142 is conformally formed on the first hard mask layer 138, in the first trench 141, and on the cap layer 126. However, the trench 141 is not completely filled with the gate spacer layer 142.

In some embodiments, the gate spacer layer 142 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 142 is formed by a deposition process, such as CVD process, ALD process, another applicable process, or a combination thereof.

Afterwards, as shown in FIG. 2P, a portion of the gate spacer layer 142 is removed to form a second trench 143, and a portion of the topmost second semiconductor layer 108 is removed to form a recess 145, in accordance with some embodiments. The portion of the gate spacer layer 142 and the portion of the topmost second semiconductor layer 108 are removed simultaneously. It should be noted that the top portion of the cladding layer 118 exposed by the second trench 143 and the portion of the topmost second semiconductor layer 108 are also removed simultaneously. More specifically, the horizontal portions of the gate spacer layer 142 are removed. The horizontal portions of the gate spacer layer 142 includes a first portion above the first hard mask layer 138 and a second portion at the bottom of the trench 141. In some embodiments, the width of the second trench 143 is greater than the width of the first trench 141 since a portion of the gate spacer layer 142 is removed.

In some embodiments, the portion of the gate spacer layer 142 and the portion of the topmost second semiconductor layer 108 are removed by an etching process, such as dry etching process. In some embodiments, the dry etching process is performed by using a gas including fluorocarbon (CxHyFz) gas.

Afterwards, as shown in FIG. 2Q, a dummy gate dielectric layer 146 is formed in the recess 145, and a dummy gate electrode layer 148 is formed in the second trench 143 and on the dummy gate dielectric layer 146, in accordance with some embodiments. In addition, the dummy gate electrode layer 148 is formed on the gate spacer layer 142 and the first hard mask layer 138.

The top surface of the dummy gate dielectric layer 146 is lower than the top surface of the topmost second semiconductor 108 and the top surface of the first oxide layer 136.

In some embodiments, the dummy gate dielectric layer 146 is made of silicon oxide. In some embodiments, an oxidation process is performed on the exposed second semiconductor layers 108 to form the dummy gate dielectric layer 146. In some embodiments, the exposed second semiconductor layers 108 is exposed in an oxidation process (e.g., a dry oxidation process, or a wet oxidation process). In some embodiments, the exposed second semiconductor layers 108 is exposed in the wet process including water, hydrogen peroxide or ozone to perform the oxidation process.

In some embodiments, the dummy gate electrode layer 148 is made of polysilicon. In some embodiments, the dummy gate electrode layer 148 is formed by a deposition process, such as CVD process, ALD process, another applicable process, or a combination thereof.

Afterwards, as shown in FIG. 2R, the top portion of the dummy gate electrode layer 148 is removed, in accordance with some embodiments. As a result, the top surface of the gate spacer layer 142 and the top surface of the first hard mask layer 138 are exposed. In some embodiments, the portion of the dummy gate electrode layer 148 is removed by a planarizing process, such as a chemical mechanical polishing (CMP) process.

Afterwards, as shown in FIG. 2S, another portion of the dummy gate electrode layer 148 is removed to form an opening 151, in accordance with some embodiments. In some embodiments, another portion of the dummy gate electrode layer 148 is removed by an etching process.

Afterwards, as shown in FIG. 2T, a second hard mask layer 152 is formed in the opening 151 and over the first hard mask layer 138, in accordance with some embodiments. Afterwards, the portion of the second hard mask layer 152 outside of the opening 151 is removed to expose the top surface of the first hard mask layer 138.

It should be noted that the first hard mask layer 138 and the second hard mask layer 152 are made of different materials. The first hard mask layer 138 has a high etching selectivity with respect to the second hard mask layer 152, and therefore the second hard mask layer 152 is removed but the first hard mask layer 138 is remaining. In some embodiments, the second hard mask layer 152 is made of silicon nitride (SiN), silicon carbide (SiC), silicon oxynitride (SiON), silicon carbon nitride (SiCN), silicon oxide carbonitride (SiOCN), or another applicable material. In some embodiments, the second hard mask layer 152 is formed by a deposition process, such as CVD process, ALD process, another applicable process, or a combination thereof.

Afterwards, as shown in FIG. 2U, the first hard mask layer 138 is removed, and then the first oxide layer 136 directly below the first hard mask layer 138 is removed, in accordance with some embodiments. As a result, the cap layer 126 not covered by the dummy gate electrode layer 148 is exposed. A dummy gate structure 147 is constructed by the dummy gate dielectric layer 146 and the dummy gate electrode layer 148.

It should be noted that the second hard mask layer 152 and the first hard mask layer 138 are made of different materials, and the second hard mask layer 152 has a high etching selectivity with respect to the first hard mask layer 138. Therefore, the first hard mask layer 138 is removed, but the second hard mask layer 152 is left.

In the compared embodiment, an compared dummy gate electrode layer is formed by forming a dummy gate electrode layer over the fin structure 104-1, 104-2, and then performing a patterning process by using the hard mask layer over the dummy gate electrode layer. Since the hard mask layer has a certain thickness, the aspect ratio (height/width) of the compared dummy gate electrode layer is sum of the height of the hard mask layer and the height of the compared dummy gate electrode layer with respect to the width of the dummy gate electrode layer. Therefore, the aspect ratio of the compared dummy gate electrode layer is too high to make the compared dummy gate electrode layer collapse. Therefore, the pitch or distance between two adjacent compared dummy gate electrode layers is difficult to reduce due to the collapse issue.

In order to prevent the dummy gate electrode layers 148 collapse, in this disclosure, the dummy gate electrode layer 148 is formed without using any photoresist layer over the dummy gate electrode layer 148. In addition, the gate spacer layer 142 has already been formed before the dummy gate electrode layer 148 is formed. In contrast to compared embodiment, the aspect ratio ($H_T/W_T$) of the dummy gate electrode layer 148 of this disclosure is the sum $H_T$ of height of the second hard mask layer 152 and height of the dummy gate electrode layer 148 with respect to the sum $W_T$ of the width of the gate spacer layer 142 and the width of the dummy gate electrode layer 148. Therefore, the aspect ratio ($H_T/W_T$) of the dummy gate electrode layer 148 is calculated by greater width and smaller height (than the compared dummy gate electrode layer), and the risk of dummy gate electrode layer 148 collapse is reduced. Furthermore, the pitch or distance between two adjacent dummy gate electrode layers 148 can be reduced to about 2 nm to about 10 nm.

Afterwards, as shown in FIG. 2V, a portion of the first semiconductor layers 106 and a portion of the second semiconductor layers 108 are removed to form a source/drain (S/D) recess 153, in accordance with some embodiments. The portion of the first semiconductor layers 106 and the portion of the second semiconductor layers 108 are removed by an etching process, such as a dry etching process or wet etching process. In addition, a top portion of the cap layer 126 is also removed by the etching process.

Next, as shown in FIG. 2W, a portion of the first semiconductor layers 106 is removed to form a number of notches, and inner spacers 156 are formed in the notches, in accordance with some embodiments of the disclosure. More specifically, the portion of the first semiconductor layers 106 is exposed by the S/D recess 153 is removed to form the notches. In some embodiments, the portion of the first semiconductor layers 106 is exposed by the S/D recess 153 is removed by an etching process, such as a dry etching process or wet etching process. The inner spacers 156 can reduce the parasitic capacitance between the S/D structure 158 and the gate structure 186 (formed later).

The inner spacers 156 are directly below the gate spacer layer 142. The inner sidewall of each of the inner spacers 156 is aligned with the inner sidewall of the gate spacer layer 142. In addition, the outer sidewall of the dummy gate dielectric layer 146 is aligned with the inner sidewall of each of the inner spacers 156.

Afterwards, the S/D structure 158 is formed in the S/D recess 153. The S/D structure 158 may include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (I P), or a combination thereof. The S/D structure 158 may dope with one or more dopants. In some embodiments, the S/D structure 158 is silicon (Si) doped with phosphorus (P), arsenic (As), antimony (Sb), or another applicable dopant. Alternatively, the S/D structure 154 is silicon germanium (SiGe) doped with boron (B) or another applicable dopant.

In some embodiments, the S/D structure 158 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, when an N-type FET (NFET) device is desired, the S/D structure 158 includes an epitaxially growing silicon (epi Si). Alternatively, when a P-type FET (PFET) device is desired, the S/D structure 158 includes an epitaxially growing silicon germanium (SiGe).

Note that the topmost second semiconductor layer 108 has a U-shaped structure with a first portion directly below the gate spacer layer 142 and a second portion directly below the dummy gate electrode layer 148. The height of the first portion is greater than the height of the second portion. The top surface of the first portion is higher than the top surface of the second portion of the topmost second semiconductor layer 108. The bottommost second semiconductor layer 108 has a rectangular structure, rather than U-shaped structure.

FIGS. 3A-3I show cross-sectional representations of various stages of forming the semiconductor device structure 100a along line X-X' shown in FIG. 2W, in accordance with some embodiments of the disclosure.

Figure 3A:
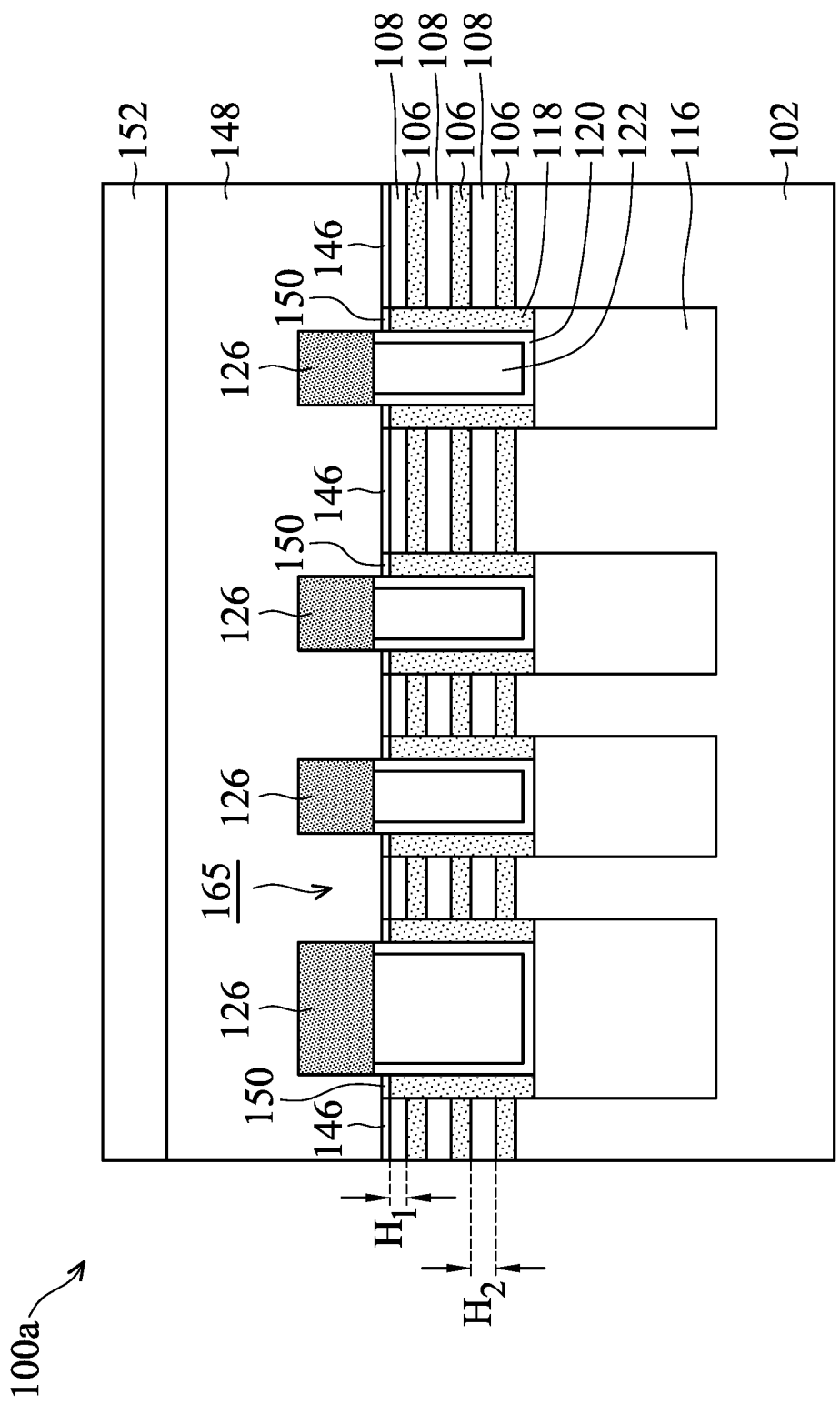
FIGS. 3A-3I show cross-sectional representations of various stages of forming the semiconductor device structure along line X-X' shown in FIG. 2W, in accordance with some embodiments of the disclosure.

As shown in FIG. 3A, the dummy gate dielectric layer 146 is formed over the topmost second semiconductor layer 108, and a top oxide layer 150 is formed over the cladding layer 118. Since the top portion of the cladding layer 118 is also oxidized by the oxidation process and the cladding layer 118 is made of silicon germanium (SiGe), the top oxide layer 150 is made of silicon germanium oxide (SiGeOx). The top oxide layer 150 is in direct contact with the liner layer 120. The top surface of the dummy gate dielectric layer 146 is substantially level with the top surface of the top oxide layer 15. Furthermore, the top surface of the top oxide layer 150 is lower than the top surface of the liner layer 120 and the top surface of the filling layer 122. The interface between the dummy gate dielectric layer 146 and the top oxide layer 150 is aligned with the outer sidewall of the cladding layer 118.

Note that since the top portion of the topmost second semiconductor layer 108 is oxidized by the oxidation process, the thickness of the topmost second semiconductor layer 108 is reduced. The topmost second semiconductor layer 108 has a first height $H_1$ along the vertical direction, and the bottommost second semiconductor layer 108 has a second height $H_2$ along the vertical direction. The second height $H_2$ is greater than the first height $H_1$. In some embodiments, the first height $H_1$ is in a range from about 2 nm to about 9 nm. In some embodiments, the second height $H_2$ is in a range from about 5 nm to about 10 nm.

The dummy gate electrode layer 148 is formed over the dummy gate dielectric layer 146 and top oxide layer 150, and the second hard mask layer 152 is formed over the dummy gate electrode layer 148. Furthermore, the dummy gate electrode layer 148 is formed over the cap layer 126.

Figure 3B:
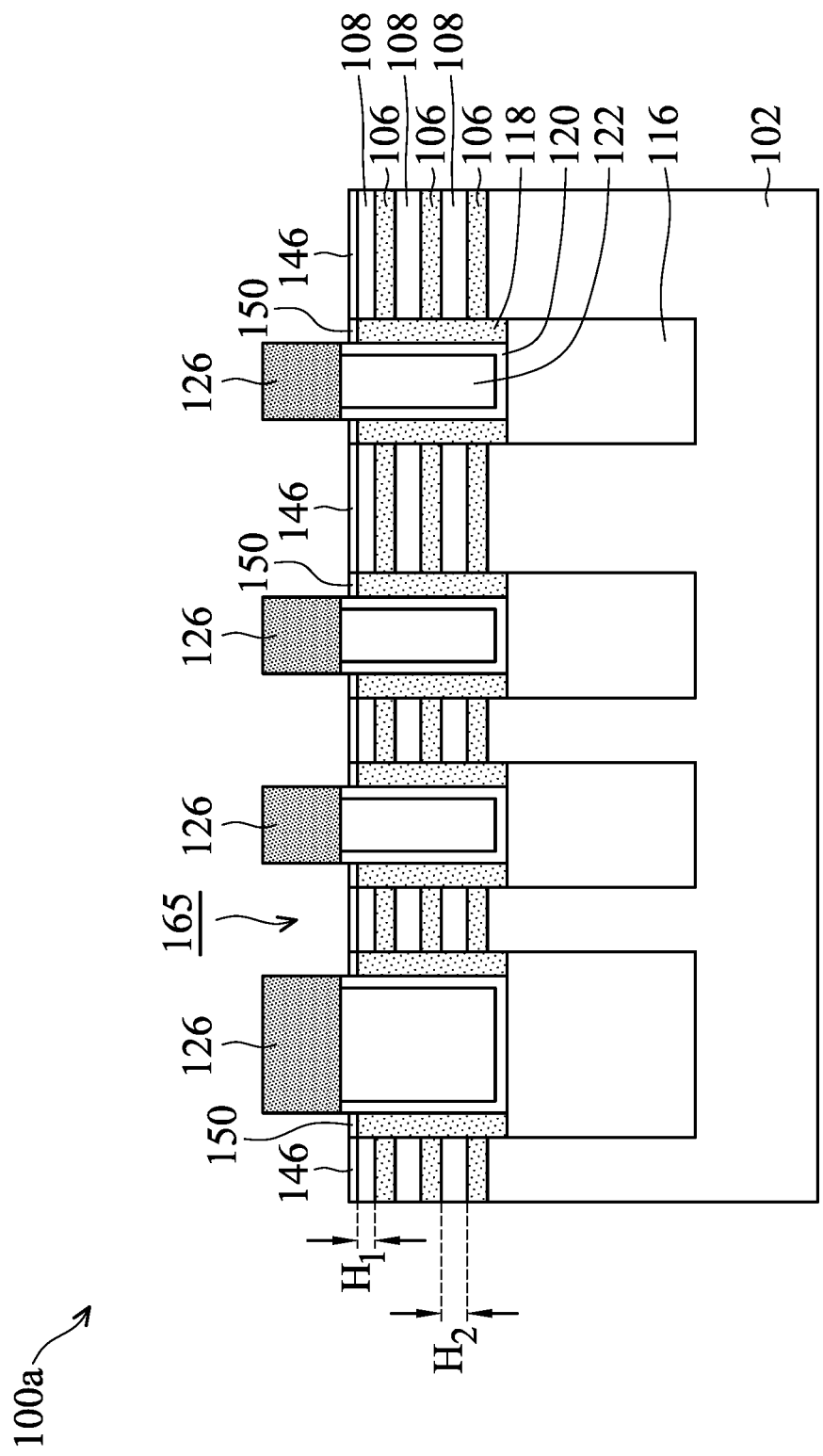

Next, as shown in FIG. 3B, the second hard mask layer 152 is removed, and then the dummy gate electrode layer 148 is removed to from a third trench 165, in accordance with some embodiments of the disclosure. As a result, the cap layer 126 is exposed, and the top surface of the dummy gate dielectric layer 146 and the top surface of the top oxide layer 150 are exposed. In addition, a portion of the sidewall of the liner layer 120 is exposed.

Figure 3C:
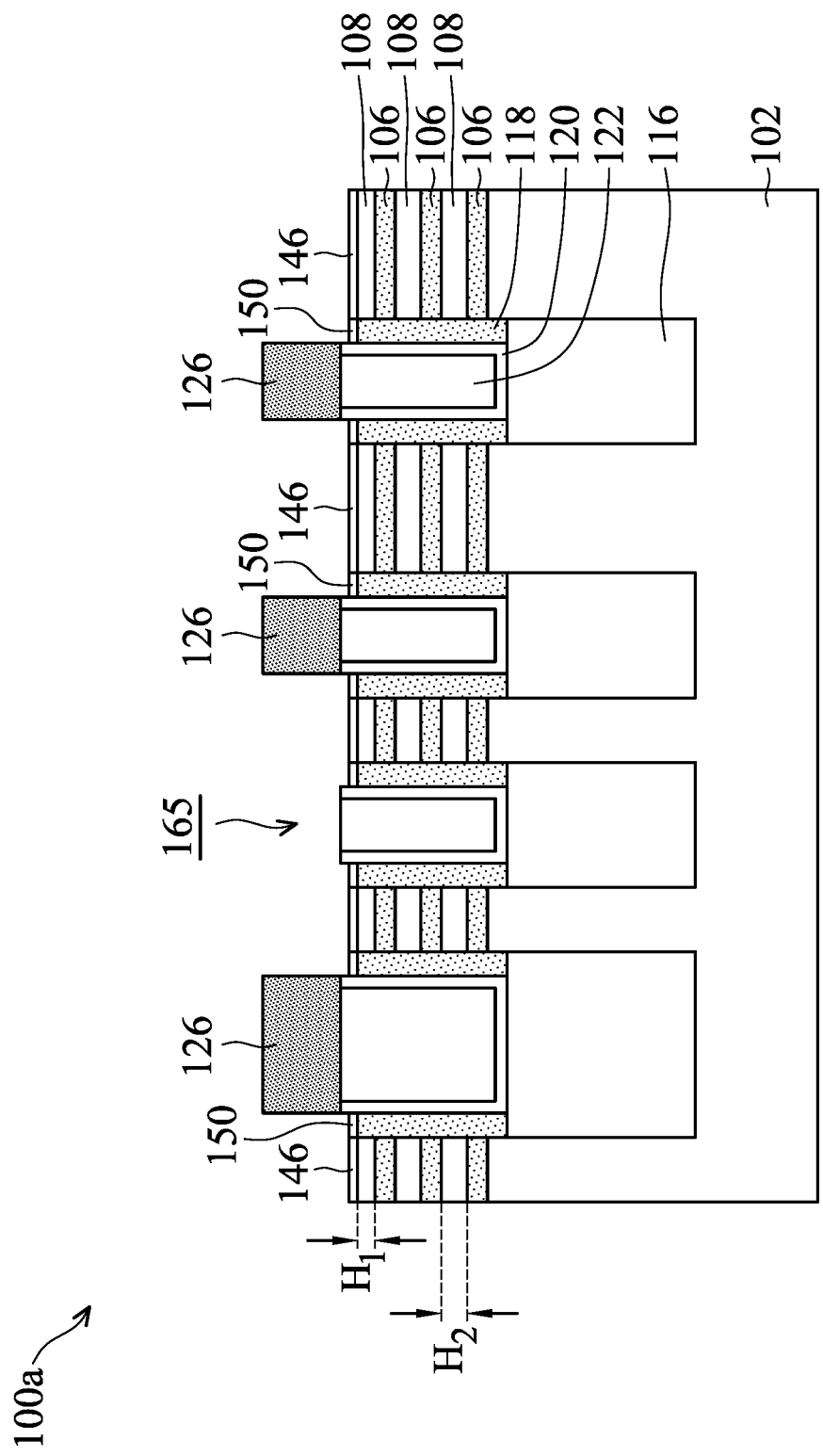

Next, as shown in FIG. 3C, a portion of the cap layer 126 is removed, in accordance with some embodiments of the disclosure. More specifically, the cap layer 126 has four portions and one portion of the cap layer 126 is removed by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 3D:
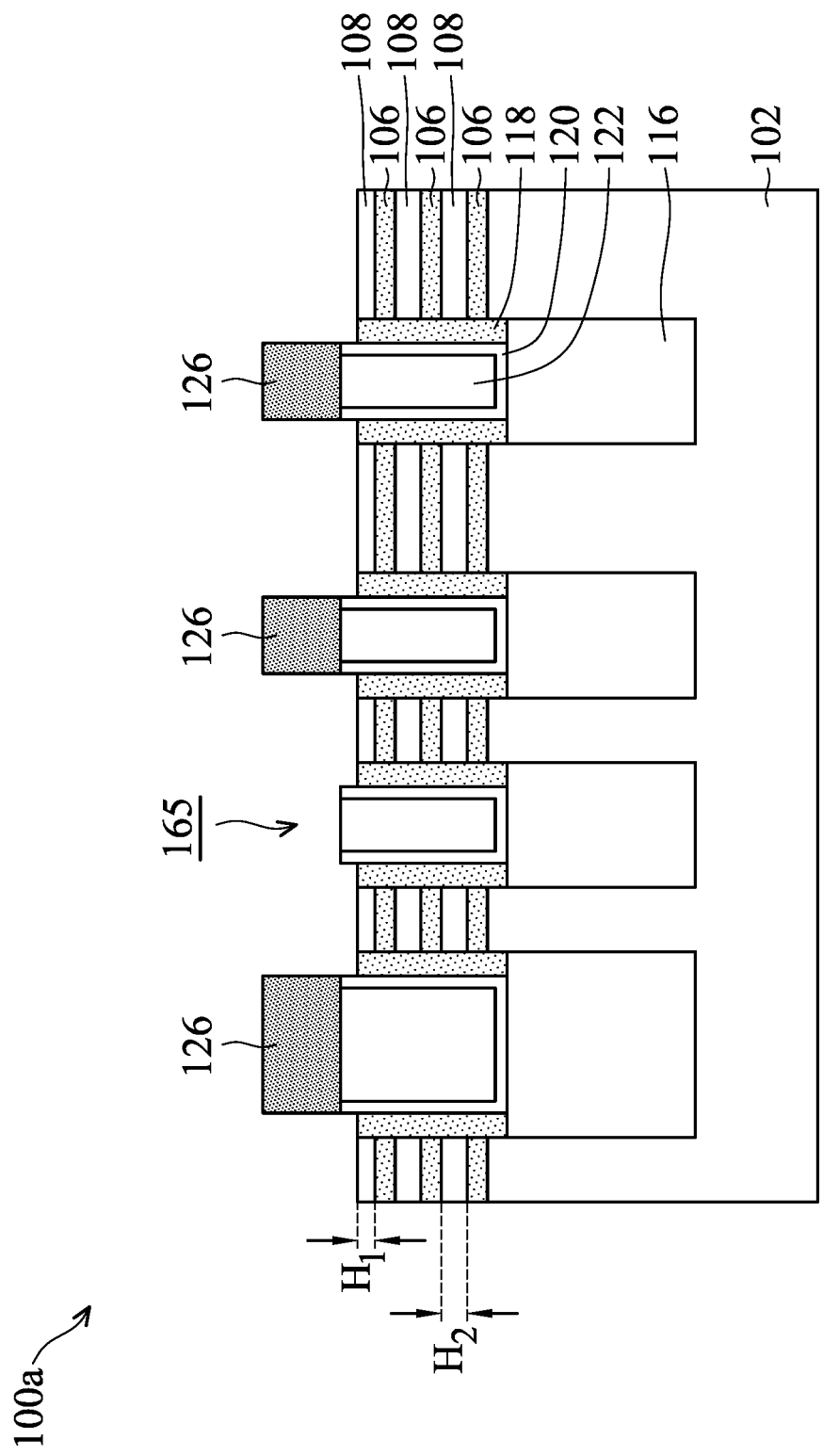

Next, as shown in FIG. 3D, the dummy gate dielectric layer 146 and the top oxide layer 150 are removed to expose the topmost second semiconductor layer 108 and the top surface of the cladding layer 118, in accordance with some embodiments of the disclosure. The dummy gate dielectric layer 146 and the top oxide layer 150 are removed by an etching process, such as a dry etching process or wet etching process.

Figure 3E:
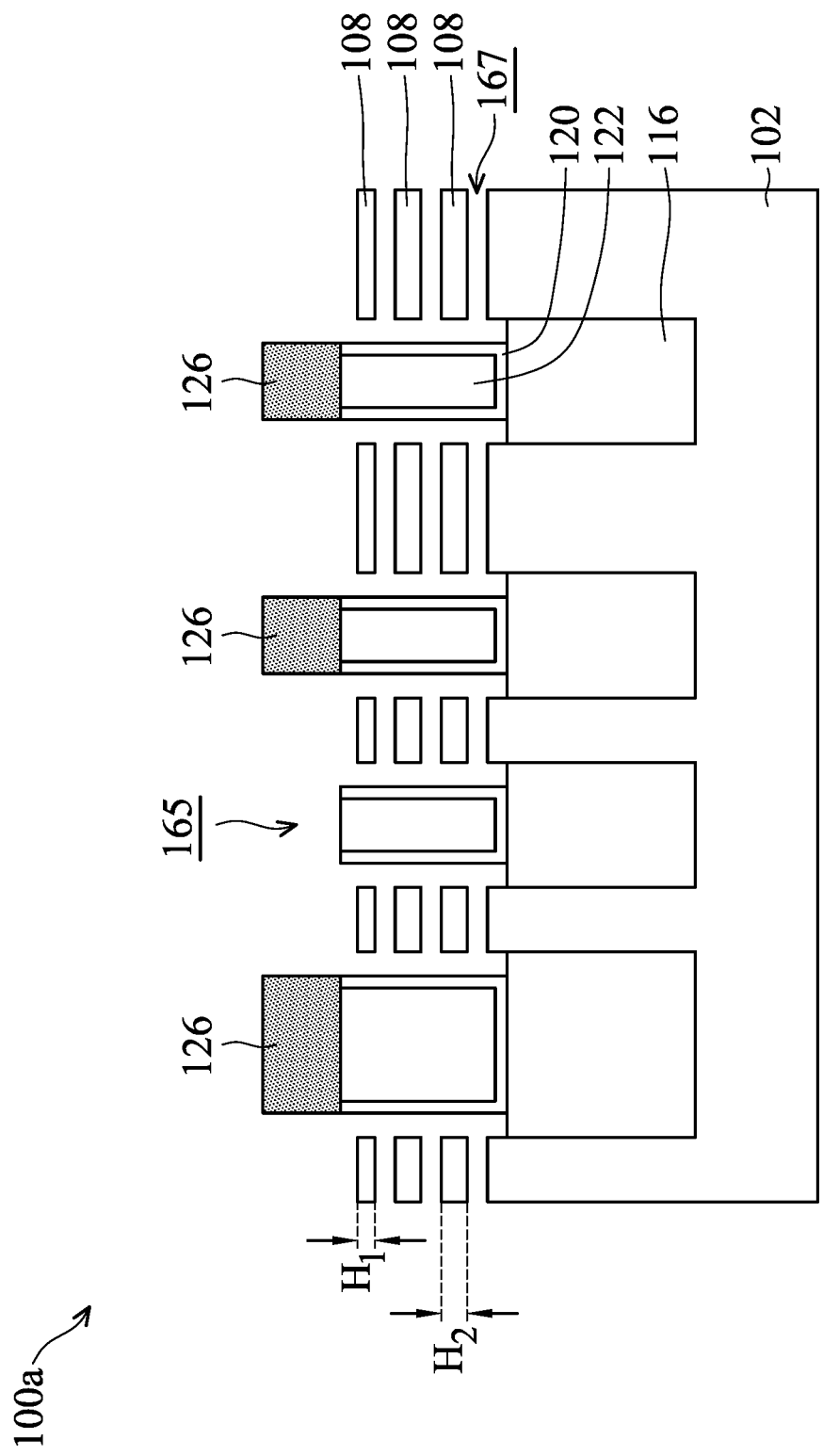

Next, as shown in FIG. 3E, the first semiconductor layers 106 and the cladding layer 118 are removed to expose a number of gaps 167, in accordance with some embodiments of the disclosure. The gaps 167 are between two adjacent second semiconductor layers 108. The suspending second semiconductor layers 108 are used as the channel region of the semiconductor layer structure 100a.

Figure 3F:
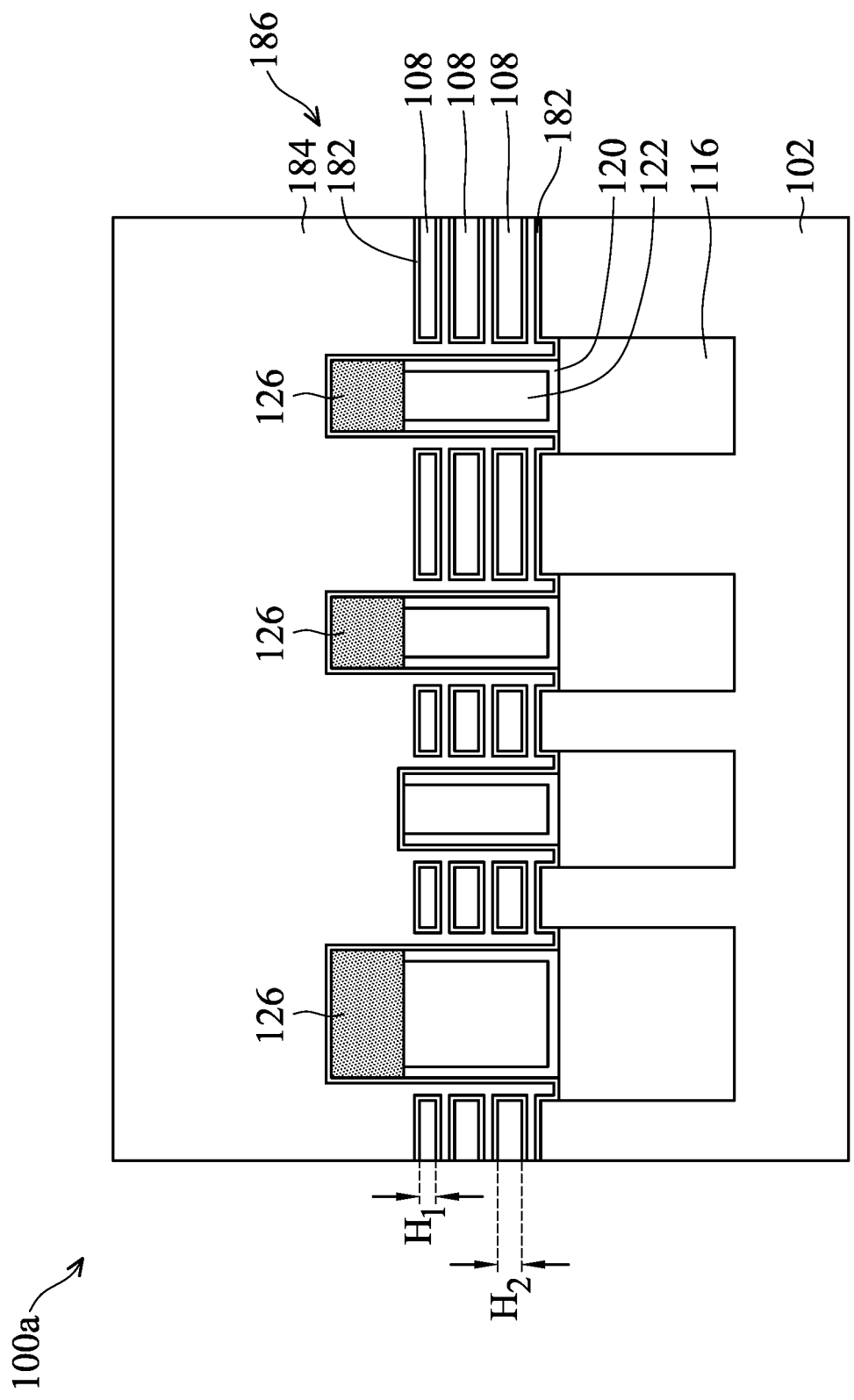

Next, as shown in FIG. 3F, a gate structure 186 is formed in the third trench 165 and the gaps 167, in accordance with some embodiments of the disclosure. As a result, the number of nanostructures (e.g. the second semiconductor layers 108) are surrounded by the gate structure 186. The portion of the second semiconductor layers 108 covered by the gate structure 186 can be referred to as a channel region.

The gate structure 186 includes a gate dielectric layer 182 and a gate electrode layer 184. The gate dielectric layer 182 is conformally formed along the main surfaces of the second semiconductor layers 108 to surround the second semiconductor layers 108. The inner spacers 156 are between the gate structure 186 and the S/D structures 158.

In some embodiments, the gate dielectric layer 182 includes a high-k dielectric layer. In some embodiments, the high-k gate dielectric layer is made of one or more layers of a dielectric material, such as $HfO_2$, HfSiO, HfSiON, HfTaO, HMO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the high-k gate dielectric layer is formed using chemical vapor deposition (CVD), atomic layer deposition (ALD), another suitable method, or a combination thereof.

In some embodiments, the gate electrode layer 184 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof.

In addition, the gate electrode layer 184 includes one or more layers of n-work function layer or p-work function layer. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof. In some embodiments, the gate electrode layer 184 is formed using chemical vapor deposition (CVD), atomic layer deposition (ALD), another suitable method, or a combination thereof.

Figure 3G:
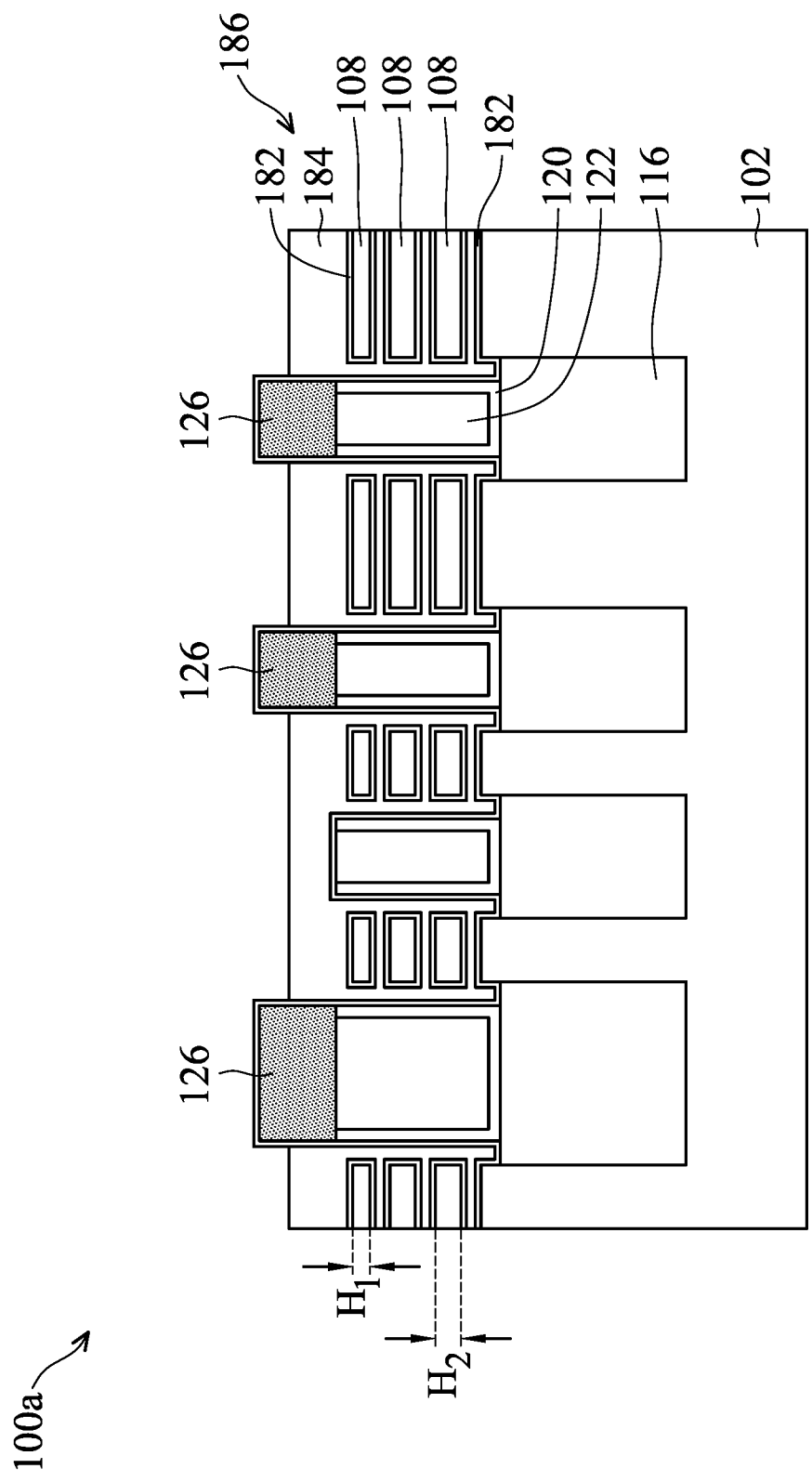

Next, as shown in FIG. 3G, a portion of the gate electrode layer 184 is removed to expose the top surface of the cap layer 126, in accordance with some embodiments of the disclosure. In some embodiments, the portion of the gate electrode layer 184 is removed by a planarizing process and an etching process. In some embodiments, the planarizing process is a chemical mechanical polishing (CMP) process. The etching process may be a dry etching process or a wet etching process.

Figure 3H:
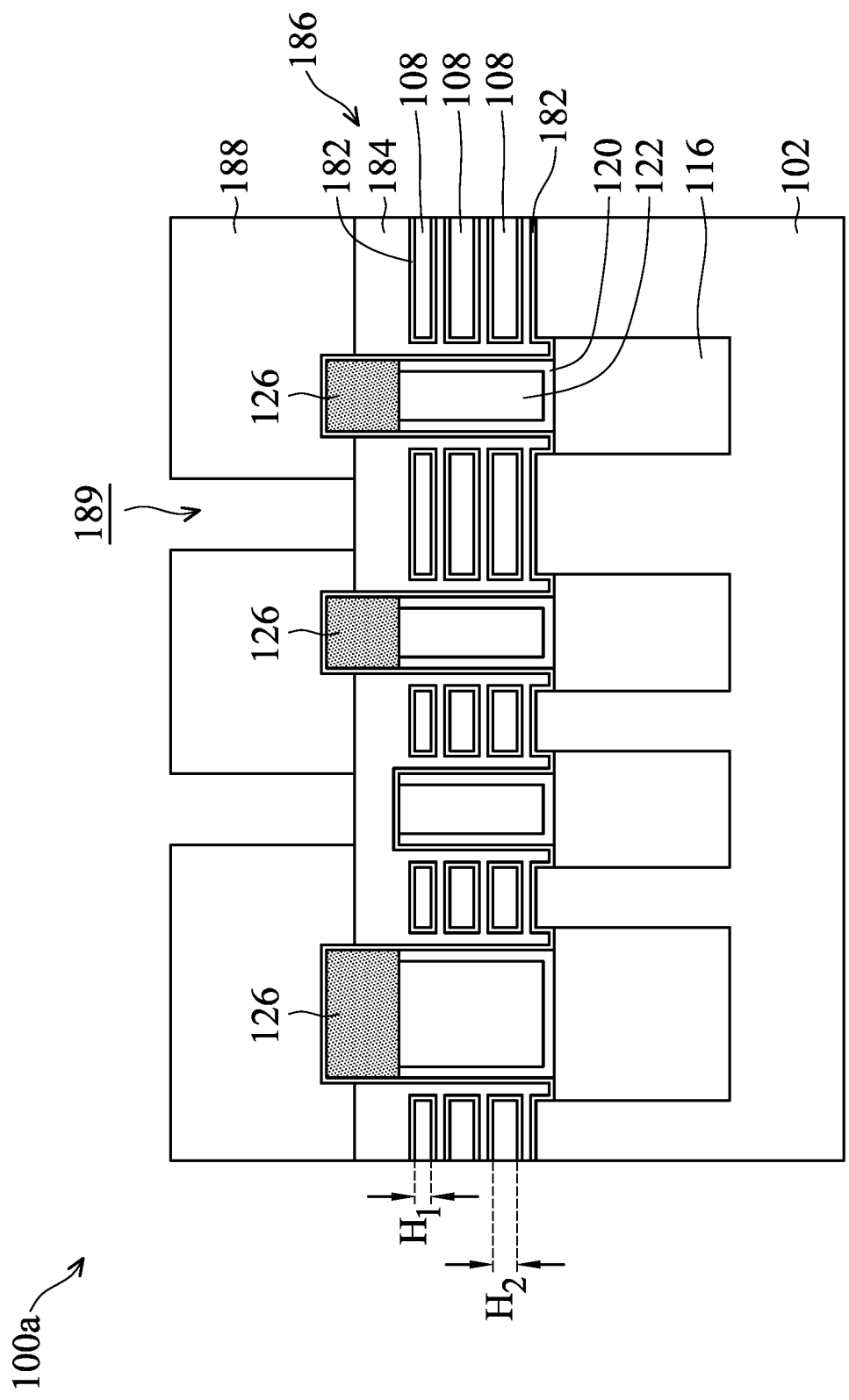

Next, as shown in FIG. 3H, a dielectric layer 188 is formed over the cap layer 126 and the gate structure 186, in accordance with some embodiments of the disclosure. In some embodiments, the dielectric layer 188 includes silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. The dielectric layer 188 may be deposited using CVD, ALD, PEALD, or a suitable method. After the deposition of the dielectric layer 188, a chemical mechanical polishing (CMP) may be performed to remove excess dielectric layer 188.

Afterwards, the dielectric layer 188 is patterned to form an opening 189. The dielectric layer 188 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 3I:
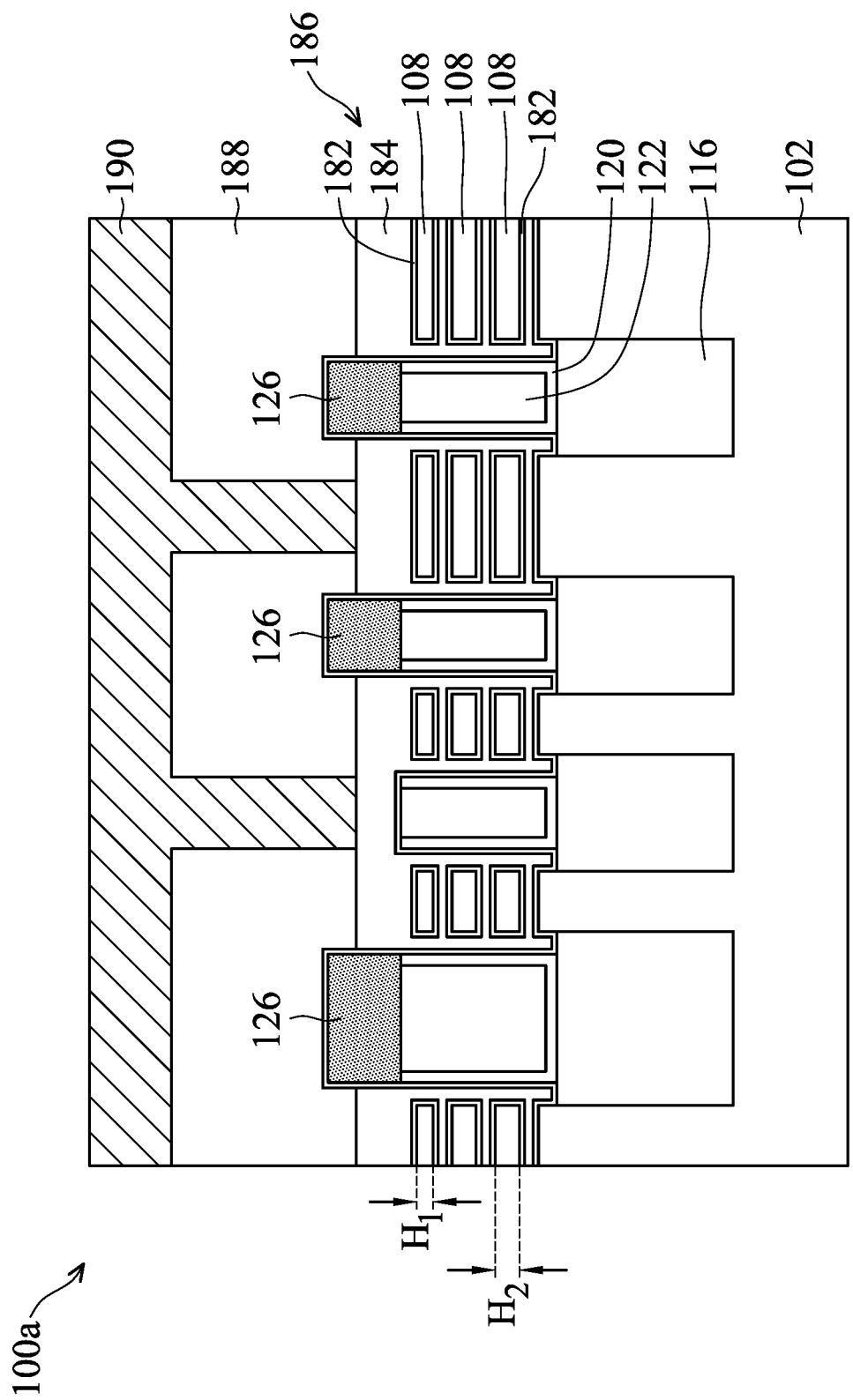

Next, as shown in FIG. 3I, a gate contact structure 190 is formed in the opening 189, in accordance with some embodiments of the disclosure. The gate contact structure 190 is electrically connected to the gate electrode layer 184 of the gate structure 186.

In some embodiments, the gate contact structure 190 is made of aluminum (Al), copper (Cu), ruthenium (Ru), nickel (Ni), molybdenum (Mo), or tungsten (W). In some embodiments, the gate contact structure 190 is formed using chemical vapor deposition (CVD), atomic layer deposition (ALD), another suitable method, or a combination thereof.

Figure 4:
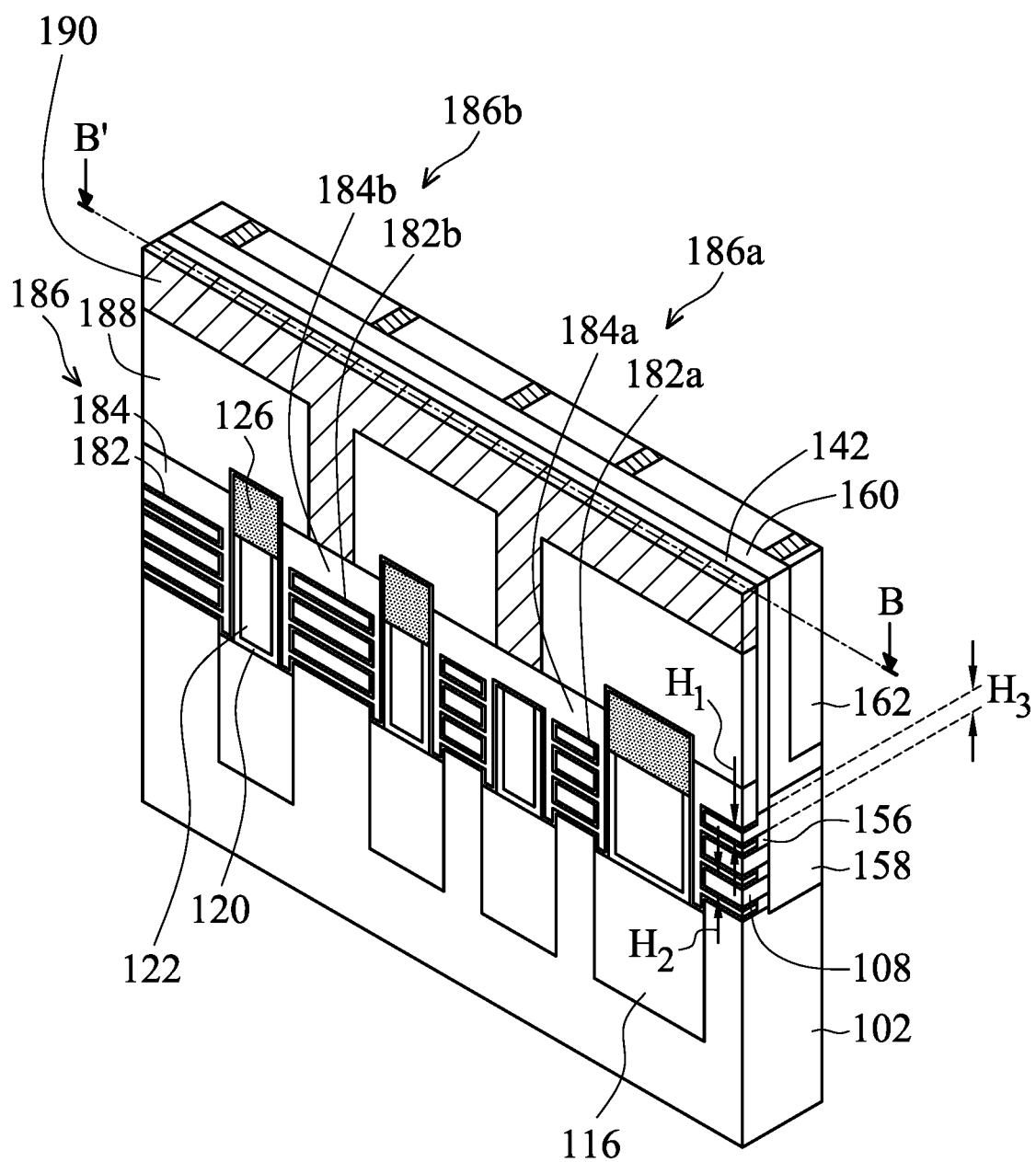
FIG. 4 illustrates a perspective view of the semiconductor structure, in accordance with some embodiments.

FIG. 4 illustrates a perspective view of the semiconductor structure 100a, in accordance with some embodiments. FIG. 3I shows a cross-sectional representation of the semiconductor device structure 100a along line BB' shown in FIG. 4, in accordance with some embodiments of the disclosure.

As shown in FIG. 4, the nanostructures (the second semiconductor layers 108) are surrounded by the first gate structure 186a. The first gate structure 186a extends across two adjacent staked nanostructures. Therefore, the dielectric feature 143 including the liner layer 120 and the filling layer 122 is covered by the first gate structure 186a. The second gate structure 186b is adjacent to the first gate structure 186a. The second gate structure 186b includes a second gate dielectric layer 182b and the second gate electrode layer 184b. The second gate structure 186b is isolated from the first gate structure 186a by cap layer 126. In other words, the top surface of the cap layer 126 is higher than the top surface of the first gate structure 186a and the top surface of the second gate structure 186b.

The topmost nanostructures (e.g. the second semiconductor layer 108) surrounded by the first gate structure 186a has a U-shaped structure, and the topmost nanostructures (e.g. the second semiconductor layer 108) surrounded by the second gate structure 186b also has a U-shaped structure. The bottommost second semiconductor layer 108 (or called nanostructures) surrounded by the first gate structure 186a has a rectangular structure with the second height $H_2$. The topmost second semiconductor layer 108 includes a first portion directly below the gate spacer layer 142 and a second portion directly below the first gate structure 186a. Since the first portion of the topmost second semiconductor layer 108 is covered by the gate spacer layer 142, the first portion of the topmost second semiconductor layer 108 is not removed by the etching process in FIG. 2P. Therefore, the first portion of the topmost second semiconductor layer 108 has a third height $H_3$, and the second portion has the first height $H_1$ (shown in FIG. 3A and FIG. 4). The third height $H_3$ is greater than the first height $H_1$. The second height $H_2$ is greater than the first height $H_1$. In some embodiments, the second height $H_2$ is substantially equal to the third height $H_3$.

Furthermore, the inner spacer 156 is directly below the first portion of the topmost second semiconductor layer 108. The bottommost second semiconductor layer 108 has a rectangular structure.

As shown in FIG. 4, the topmost surface of the first gate dielectric layer 182a is lower than the topmost surface of the nanostructure (e.g. the second semiconductor layer 108). In addition, the top surface of the S/D structure 158 is lower than the top surface of the topmost second semiconductor layer 108. The isolation structure 116 has a width along a horizontal direction which is greater than the width of the dielectric feature 134 including the liner layer 120 and filling layer 122.

Figure 5:
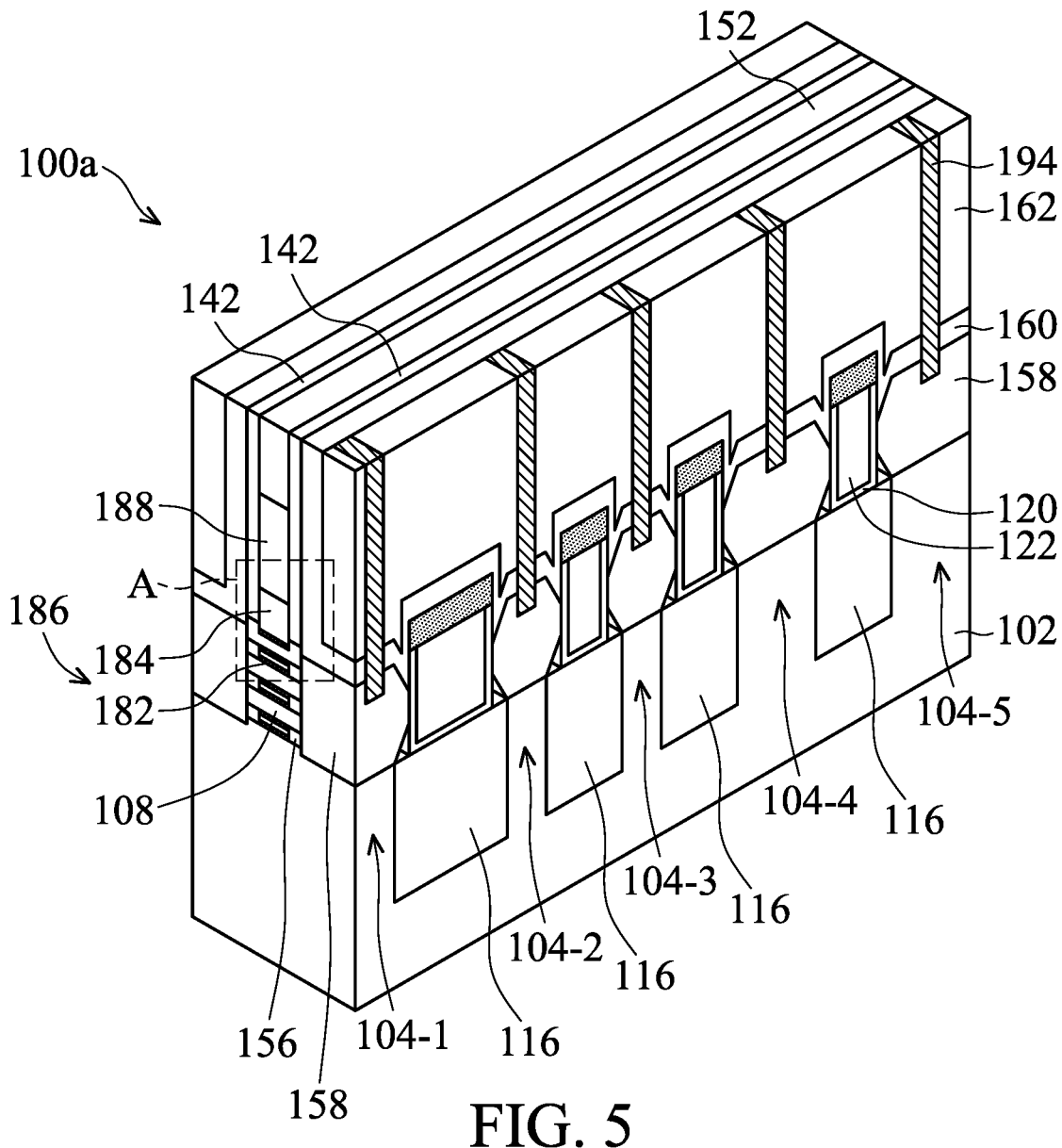
FIG. 5 illustrates a perspective view of the semiconductor structure, in accordance with some embodiments.

FIG. 5 illustrates a perspective view of the semiconductor structure 100a, in accordance with some embodiments.

An S/D contact structure 194 is formed through the ILD layer 162, the CESL 160 and the S/D structure 158, and the S/D contact structure 194 is embedded in the S/D structure 158. The S/D contact structure 194 is electrically connected to the S/D structure 158. The topmost nanostructure (e.g. the second semiconductor layer 108) has the U-shaped structure and has two protruding sidewall portions and a recessed middle portion. The gate dielectric layer 182 is formed in the recessed middle portion, and therefore the topmost surface of the gate dielectric layer 182 is lower than the top surface of the protruding portions of the topmost nanostructure. The topmost surface of the gate dielectric layer 182 is lower than the bottommost surface of the first gate spacer layer 142. In addition, the inner spacer 156 is directly below the protruding sidewall portions of the topmost nanostructure (e.g. the second semiconductor layer 108).

Figure 6:
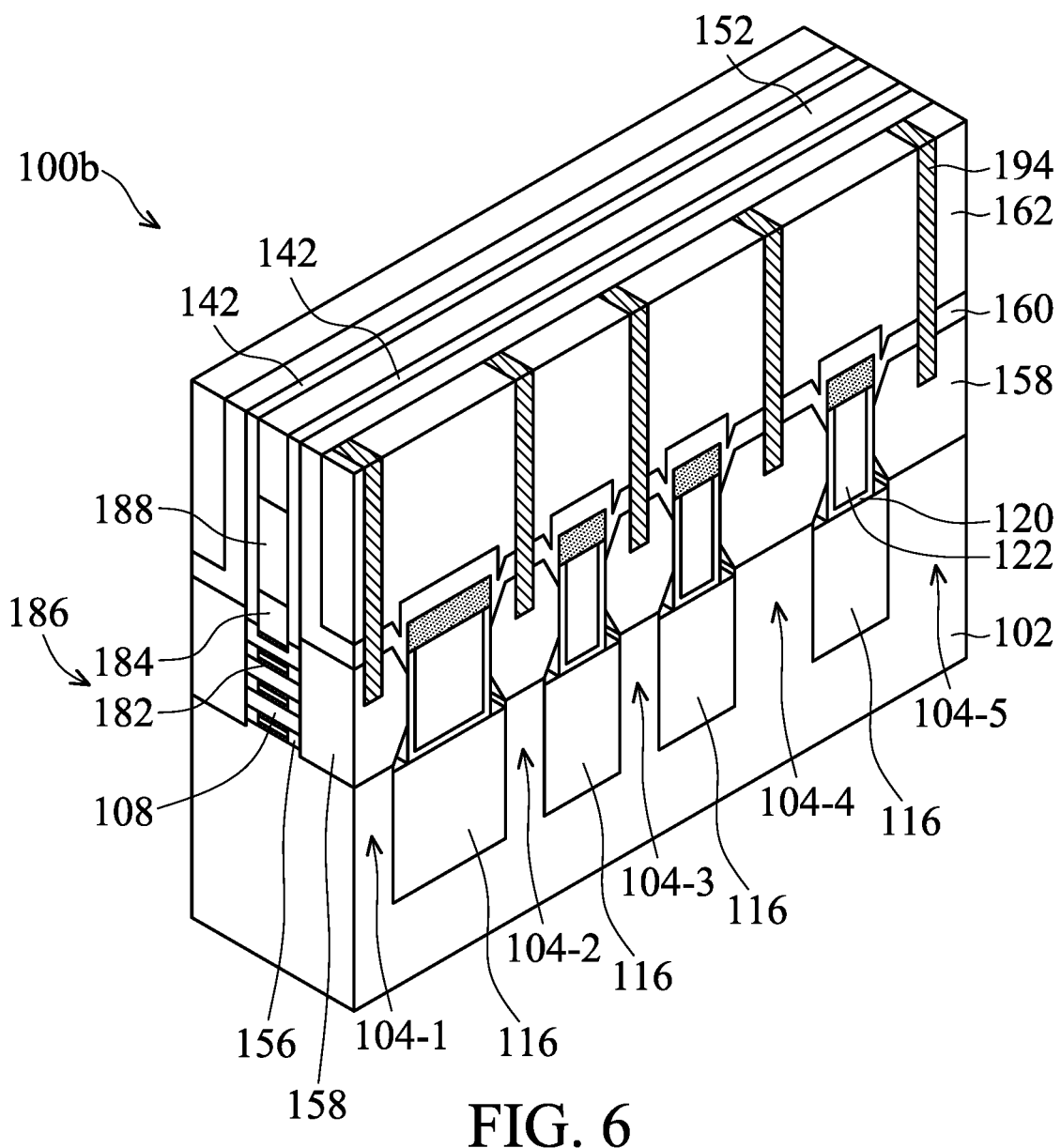
FIG. 6 illustrates a perspective view of a semiconductor structure, in accordance with some embodiments.

FIG. 6 illustrates a perspective view of a semiconductor structure 100b, in accordance with some embodiments. The semiconductor structure 100b of FIG. 6 is similar to, or the same as, the semiconductor structure 100a of FIG. 5, the difference between the FIG. 6 and FIG. 5 is the position of the S/D structure 158.

As shown in FIG. 6, the bottom surface of the S/D structure 158 is higher than the top surface of the isolation structure 116. The bottom surface of the S/D structure 158 is substantially leveled with the bottom surface of the inner spacer 156. The top surface of the S/D structure 158 is higher than the topmost nanostructure (e.g. the second semiconductor layer 108). In addition, the top surface of the S/D structure 158 is higher than the bottom surface of the gate spacer layer 142.

Figure 7:
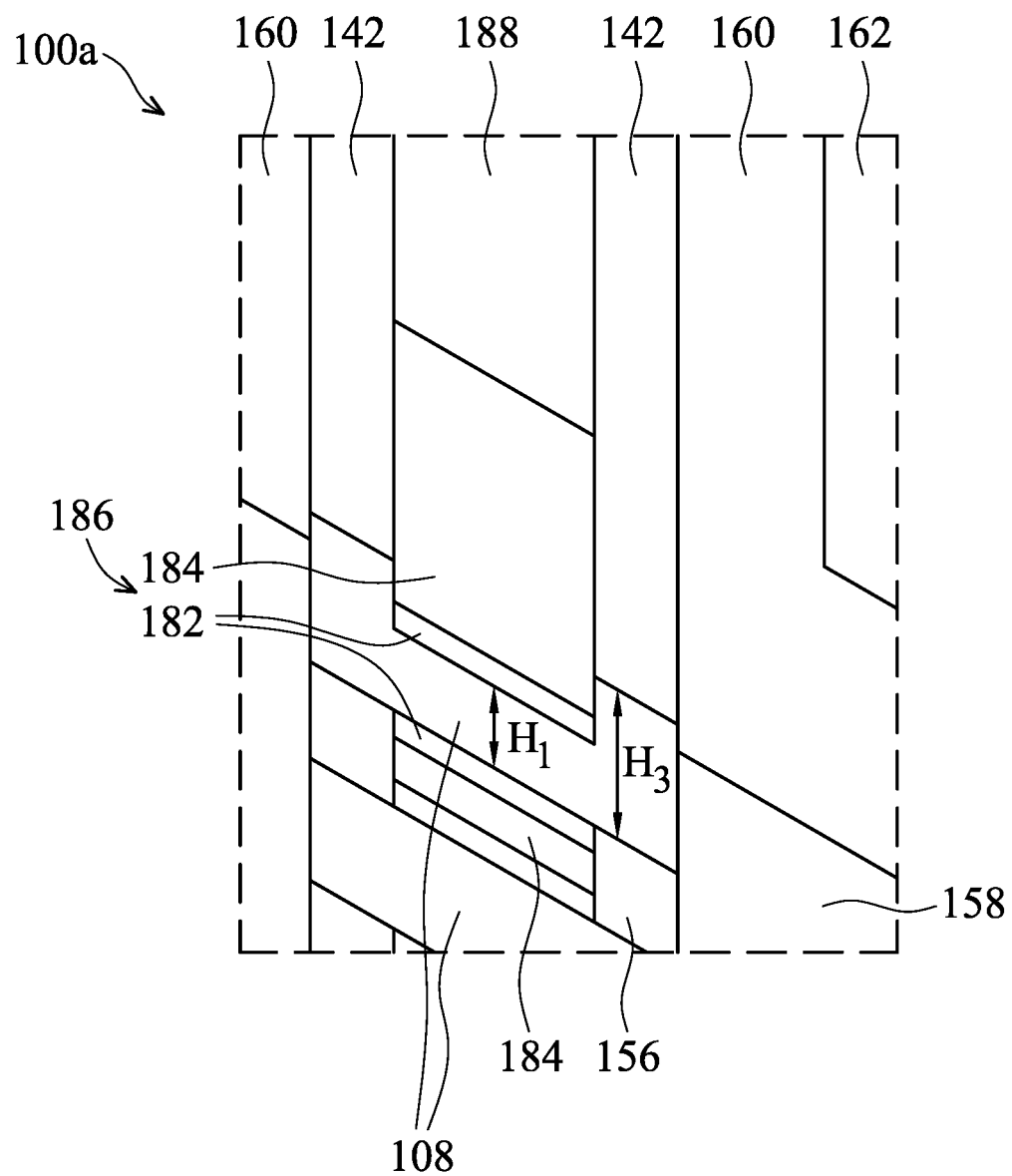
FIG. 7 is an enlarged view of region A of FIG. 6, in accordance with some embodiments.

FIG. 7 is an enlarged view of region A of FIG. 6, in accordance with some embodiments. The topmost nanostructure (e.g. the second semiconductor layer 108) has a U-shaped structure with the first portion and the second portion. The first portion is directly below the gate spacer layer 142 and has the third height $H_3$ along the vertical direction. The second portion is directly below the gate structure 186 and has the first height $H_1$. The third height $H_3$ is greater than the first height $H_1$. In addition, the topmost gate dielectric layer 182 is lower than the topmost surface of the topmost nanostructure (e.g. the second semiconductor layer 108).

It should be noted that since the dummy gate structure 147 formation sequence is changed, the dummy gate electrode layer 148 is formed after the gate spacer layer 142 is formed. The dummy gate electrode layer 148 is formed without using additional photoresist layer, and it is formed on the gate spacer layer 142. Therefore, the aspect ratio of the dummy gate structure 147 is reduced, and the risk of dummy gate structure 147 collapse is reduced. The pitch or distance between two adjacent dummy gate structures 147 can be reduced to about 2 nm to about 10 nm.

Embodiments for forming a semiconductor device structure and method for formation the same are provided. A fin structure is formed over a substrate, and the fin structure includes a number of first semiconductor layers and a number of second semiconductor layers stacked in the vertical direction. The first hard mask layer is formed over the fin structure and patterned to form a trench. A dummy gate electrode layer is formed in the trench to finish the dummy gate structure loop (or called as a poly loop). Since the dummy gate electrode layer is formed after the gate spacer layer is formed, the aspect ratio is reduced by changing the process sequence. Therefore, the risk of dummy gate electrode layer collapse is reduced, and the yield of semiconductor device structure is improved.

In some embodiments, a semiconductor device structure is provided. The semiconductor device structure includes a first fin structure formed over a substrate, and the first fin structure includes a plurality of first nanostructures stacked in a vertical direction. The semiconductor device structure includes a first gate structure surrounding the first nanostructures. The semiconductor device structure also includes a first gate spacer layer formed adjacent to the first gate structure. A topmost first nanostructure has a first portion directly below the gate spacer layer and a second portion directly below the first gate structure, and the first portion has a first height along the vertical direction, the second portion has a second height along the vertical direction, and the first height is greater than the second height.

In some embodiments, a semiconductor device structure is provided. The semiconductor device structure includes a first fin structure formed over a substrate, and the first fin structure includes a plurality of first nanostructures stacked in a vertical direction. The semiconductor device structure includes a first gate structure surrounding the first nanostructures, and the first gate structure includes a first gate dielectric layer and a first gate electrode. The semiconductor device structure includes a first S/D structure formed adjacent to the first gate structure, and a topmost surface of the first gate dielectric layer is lower than a topmost surface of the first nanostructures.

In some embodiments, a method for forming a semiconductor device structure is provided. The method includes forming a first fin structure and a second fin structure over a substrate, and the first fin structure includes a plurality of first semiconductor layers and a plurality of second semiconductor layers stacked in a vertical direction, and the second fin structure includes a plurality of first semiconductor layers and a plurality of second semiconductor layers stacked in a vertical direction. The method includes forming a hard mask layer over the first fin structure and the second fin structure, and patterning the hard mask layer to form a trench. The method includes forming a gate spacer layer in the trench, and forming a dummy gate electrode layer in the trench and on the gate spacer layer. The method also includes removing the hard mask layer, and removing a portion of the first fin structure and a portion of the second fin structure to form a first S/D recess and a second S/D recess. The method includes forming a first source/drain (S/D) structure in the first S/D recess and a second S/D structure in the second S/D recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first fin structure and a second fin structure over a substrate, wherein the first fin structure comprises a plurality of first semiconductor layers and a plurality of second semiconductor layers stacked in a vertical direction, and the second fin structure comprises a plurality of first semiconductor layers and a plurality of second semiconductor layers stacked in a vertical direction;
    forming a hard mask layer over the first fin structure and the second fin structure;
    patterning the hard mask layer to form a trench;
    forming a gate spacer layer in the trench;
    forming a dummy gate electrode layer in the trench and on the gate spacer layer;
    removing the hard mask layer;
    removing a portion of the first fin structure and a portion of the second fin structure to form a first S/D recess and a second S/D recess; and
    forming a first source/drain (S/D) structure in the first S/D recess and a second S/D structure in the second S/D recess.

2. The method for forming the semiconductor device structure as claimed in claim 1, further comprising:
    forming a first oxide layer over the first fin structure and the second fin structure before forming the hard mask layer;
    forming the hard mask layer over the first oxide layer;
    forming the gate spacer layer in the trench;
    removing a portion of the gate spacer layer and a portion of the first oxide layer exposed by the trench; and
    removing a portion of a topmost first semiconductor layer to form a recess.

3. The method for forming the semiconductor device structure as claimed in claim 2, further comprising:
    forming a second oxide layer over the hard mask layer, wherein the hard mask layer is between the first oxide layer and the second oxide layer.

4. The method for forming the semiconductor device structure as claimed in claim 2, further comprising:
    forming a dummy gate dielectric layer in the recess, wherein the dummy gate dielectric layer is in direct contact with the topmost first semiconductor layer.

5. The method for forming the semiconductor device structure as claimed in claim 4, further comprising:
    removing the dummy gate electrode layer;
    removing the dummy gate dielectric layer to form a trench;
    removing the second semiconductor layers to form a gap; and
    forming a gate structure in the trench and the gap.

6. The method for forming the semiconductor device structure as claimed in claim 1, further comprising:
    forming a dielectric feature between the first fin structure and the second fin structure, wherein the dielectric feature comprises a cap layer above the first fin structure, and the hard mask layer is over the cap layer.

7. The method for forming the semiconductor device structure as claimed in claim 6, further comprising:
    forming a first oxide layer over the cap layer;
    forming the hard mask layer over the first oxide layer; and
    removing the first oxide layer before forming the first S/D recess and the second S/D recess.

8. A method for forming a semiconductor device structure, comprising:
    forming a first fin structure and a second fin structure over a substrate, wherein the first fin structure comprises a plurality of first semiconductor layers and a plurality of second semiconductor layers stacked in a vertical direction, and the second fin structure comprises a plurality of first semiconductor layers and a plurality of second semiconductor layers stacked in a vertical direction;
    forming a dielectric feature between the first fin structure and the second fin structure;
    forming a hard mask layer over the first fin structure and the second fin structure;
    patterning the hard mask layer to form a trench;
    forming a gate spacer layer in the trench;
    forming a dummy gate electrode layer in the trench and on the gate spacer layer;
    removing the hard mask layer;
    removing the dummy gate electrode layer to form trench;
    removing the second semiconductor layers to form a gap; and
    forming a gate structure in the trench and the gap.

9. The method for forming the semiconductor device structure as claimed in claim 8, further comprising:
 removing a portion of the first semiconductor layers to form notches; and
 forming inner spacer layers in the notches.

10. The method for forming the semiconductor device structure as claimed in claim 8, further comprising:
 forming a dielectric layer on the dielectric feature and the gate structure; and
 forming a gate contact structure through the dielectric layer, wherein the gate contact structure is electrically connected to the gate structure.

11. The method for forming the semiconductor device structure as claimed in claim 8, further comprising:
 forming a cladding layer on the first fin structure and the second fin structure before forming the dielectric feature.

12. The method for forming the semiconductor device structure as claimed in claim 8, further comprising:
 removing a portion of a topmost first semiconductor layer to form a recess; and
 forming a dummy gate dielectric layer in the recess.

13. The method for forming the semiconductor device structure as claimed in claim 8, wherein the dielectric feature comprises a cap layer, wherein a top surface of the cap layer is higher than a top surface of the gate structure.

14. The method for forming the semiconductor device structure as claimed in claim 8, further comprising:
 forming a first oxide layer over the first fin structure and the second fin structure before forming the hard mask layer over the first fin structure and the second fin structure.

15. A method for forming a semiconductor device structure, comprising:
 forming a first fin structure and a second fin structure over a substrate, wherein the first fin structure comprises a plurality of first semiconductor layers and a plurality of second semiconductor layers stacked in a vertical direction, and the second fin structure comprises a plurality of first semiconductor layers and a plurality of second semiconductor layers stacked in a vertical direction;
 forming a first oxide layer over the first fin structure and the second fin structure;
 forming a hard mask layer on the first oxide layer;
 patterning the hard mask layer to form a trench;
 removing a portion of the first oxide layer exposed by the trench;
 forming a gate spacer layer in the trench;
 forming a dummy gate electrode layer in the trench and on the gate spacer layer;
 removing the hard mask layer; and
 replacing the dummy gate electrode layer with a gate structure.

16. The method for forming the semiconductor device structure as claimed in claim 15, further comprising:
 removing a portion of a topmost first semiconductor layer to form a recess; and
 forming a dummy gate dielectric layer in the recess.

17. The method for forming the semiconductor device structure as claimed in claim 15, further comprising:
 forming a cladding layer on the first fin structure and the second fin structure; and
 removing the cladding layer before replacing the dummy gate electrode layer with the gate structure.

18. The method for forming the semiconductor device structure as claimed in claim 15, further comprising:
 forming a dielectric feature between the first fin structure and the second fin structure, wherein the dielectric features comprises a liner layer, a filling layer and a cap layer on the liner layer and the filling layer.

19. The method for forming the semiconductor device structure as claimed in claim 18, further comprising:
 forming the hard mask layer on the dielectric feature.

20. The method for forming the semiconductor device structure as claimed in claim 15, further comprising:
 removing the second semiconductor layers to form nanostructures; and
 forming the gate structure surrounding the nanostructures.

* * * * *